(12) United States Patent
Kang et al.

(10) Patent No.: US 12,253,887 B2
(45) Date of Patent: *Mar. 18, 2025

(54) ELECTRIC DEVICE INCLUDING FLEXIBLE DISPLAY

(71) Applicant: Samsung Electronics Co., Ltd., Suwon-si (KR)

(72) Inventors: Youngmin Kang, Suwon-si (KR); Moonchul Shin, Suwon-si (KR); Sungho Ahn, Suwon-si (KR); Yeonggyu Yoon, Suwon-si (KR); Seungjoon Lee, Suwon-si (KR); Jihyung Jung, Suwon-si (KR); Joongyeon Cho, Suwon-si (KR); Junyoung Choi, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/372,476

(22) Filed: Sep. 25, 2023

(65) Prior Publication Data

US 2024/0012452 A1    Jan. 11, 2024

Related U.S. Application Data

(63) Continuation of application No. 17/530,742, filed on Nov. 19, 2021, now Pat. No. 11,797,053, which is a (Continued)

(30) Foreign Application Priority Data

Nov. 6, 2020  (KR) .................. 10-2020-0147368
Mar. 22, 2021 (KR) .................. 10-2021-0036725

(51) Int. Cl.
*G06F 1/16* (2006.01)
*H10K 77/10* (2023.01)
*H10K 102/00* (2023.01)

(52) U.S. Cl.
CPC .......... G06F 1/1652 (2013.01); H10K 77/111 (2023.02); *H10K 2102/311* (2023.02)

(58) Field of Classification Search
CPC ........ G06F 1/1652; G06F 1/16; G06F 1/1624; G06F 1/1641; G06F 1/1637
See application file for complete search history.

(56) References Cited

U.S. PATENT DOCUMENTS 9,704,932 B2   7/2017 Lee
10,209,742 B2  2/2019 Shin
(Continued)

FOREIGN PATENT DOCUMENTS

CN   109545087   3/2019
CN   113345330   9/2021
(Continued)

OTHER PUBLICATIONS

Extended Search Report dated Jan. 18, 2024 in European Patent Application No. 21889594.4.
(Continued)

*Primary Examiner* — Abhishek M Rathod
(74) *Attorney, Agent, or Firm* — Nixon & Vanderhye, P.C.

(57) ABSTRACT

An example electronic device includes a housing, and a flexible display in which an area of a display region is configured to be adjusted based on a sliding movement of at least a portion of the housing. The flexible display may include a first region fixedly visible from outside through a first direction of the electronic device, a second region extending from one end of the first region and variably (Continued)

visible from the outside based on the movement of the housing, and including a first bending part bent from one end of the first region in a second direction opposite to the first direction and disposed to face a second lateral direction perpendicular to the first direction, and a first extension part extending from one end of the first bending part and disposed in parallel with the first region, and a second bending part bent from one end of the first extension part in the second direction and disposed to face a first lateral direction opposite to the second lateral direction.

14 Claims, 20 Drawing Sheets

Related U.S. Application Data continuation of application No. PCT/KR2021/015935, filed on Nov. 4, 2021.

(56) References Cited

U.S. PATENT DOCUMENTS

| | | | |
|---|---|---|---|
| 10,303,218 | B2 | 5/2019 | Jones |
| 10,711,980 | B2 | 7/2020 | Hirakata |
| 10,955,876 | B1 | 3/2021 | Song |
| 10,996,715 | B2 * | 5/2021 | Zhang .................. G06F 1/1641 |
| 11,005,069 | B2 | 5/2021 | Li |
| 11,797,053 | B2 * | 10/2023 | Kang .................. G06F 1/1624 |
| 2013/0265257 | A1 | 10/2013 | Jung et al. |
| 2015/0021570 | A1 | 1/2015 | Kim |
| 2015/0230349 | A1 | 8/2015 | Lee et al. |
| 2016/0034000 | A1 | 2/2016 | Lee et al. |
| 2016/0172623 | A1 | 6/2016 | Lee |
| 2017/0199544 | A1 | 7/2017 | Choi |
| 2019/0172377 | A1 | 6/2019 | Kim et al. |
| 2020/0044003 | A1 | 2/2020 | Cho et al. |
| 2020/0221587 | A1 | 7/2020 | An |
| 2020/0335017 | A1 | 10/2020 | Yao et al. |
| 2020/0363841 | A1 | 11/2020 | Kim |
| 2020/0409421 | A1 | 12/2020 | Cho et al. |
| 2021/0278878 | A1 | 9/2021 | Shim |
| 2021/0337049 | A1 * | 10/2021 | Noh .................. H04M 1/0237 |

FOREIGN PATENT DOCUMENTS

| | | |
|---|---|---|
| KR | 10-2013-0113901 | 10/2013 |
| KR | 10-2015-0094833 | 8/2015 |
| KR | 10-2016-0017247 | 2/2016 |
| KR | 10-2018-0039027 | 4/2018 |
| KR | 10-2019-0106322 | 4/2018 |
| KR | 10-2018-0108271 | 10/2018 |
| KR | 10-2019-0049454 | 5/2019 |
| KR | 10-2020-0086505 | 7/2020 |
| KR | 10-2408844 | 6/2022 |

OTHER PUBLICATIONS

Search Report and Written Opinion issued Feb. 8, 2022 in counterpart International Patent Application No. PCT/KR2021/015935.

Kang et al., U.S. Appl. No. 17/530,742, filed Nov. 19, 2021.

* cited by examiner

ELECTRIC DEVICE INCLUDING FLEXIBLE DISPLAY

CROSS-REFERENCE TO RELATED APPLICATIONS

This application is a continuation of Ser. No. 17/530,742, filed on Nov. 19, 2021, now U.S. Pat. No. 11,797,053, which is a continuation of International Application No. PCT/KR2021/015935, designating the United States, filed on Nov. 4, 2021, in the Korean Intellectual Property Receiving Office and claiming priority to Korean Patent Application No. 10-2020-0147368, filed on Nov. 6, 2020, in the Korean Intellectual Property Office and Korean Patent Application No. 10-2021-0036725, filed on Mar. 22, 2021, in the Korean Intellectual Property Office, the disclosures of all of which are incorporated by reference herein in their entireties.

BACKGROUND

Field

The disclosure relates to an electronic device including a flexible display.

Description of Related Art

With the growth of display technology, the research and development of an electronic device including a flexible display are being actively conducted. The flexible display is capable of being folded, bent, rolled, or unfolded. In the electronic device including the flexible display, the size of a screen shown to a user may be changed.

As the flexible display is applied to the electronic device, a slidable electronic device (or expandable electronic device) having a variable display area of a display is actively researched and developed. In such an electronic device, a portion of the flexible display may move in a slide-in or slide-out manner in conjunction with a sliding movement of a portion of an electronic device housing.

A stack structure of the flexible display includes a plurality of layers, which may be attached to each other by an adhesive member. The flexible display applied to the slidable electronic device is configured to be bent at least in part, so that an internal stress that causes a length deviation and/or slip between such layers at one end of the flexible display may occur.

The internal stress occurring at one end of the flexible display may cause at least a portion of the flexible display to be lifted or warped. This phenomenon may cause product defects and/or make it difficult to slide the flexible display, so that more force may be required to slide the flexible display.

SUMMARY

Embodiments of the disclosure may provide an electronic device forming a second bending part in a flexible display, thereby providing an electronic device that can offset an internal stress causing a length deviation and/or slip between a plurality of layers and reduce a lifting or warping phenomenon in at least a portion of the flexible display.

Embodiments of the disclosure may reduce a phenomenon that at least a portion of the flexible display is lifted or warped, thereby providing an electronic device that allows the flexible display to easily slide with a small force, offer user convenience, and reduce driving power of the electronic device.

An electronic device according to various example embodiments includes: a housing, and a flexible display having a display region, an area of which is configured to be adjusted in conjunction with a sliding movement of at least a portion of the housing. The flexible display may include: a first region fixedly visible from outside through a first direction of the electronic device, a second region configured to be extended from one end of the first region and variably visible from the outside in conjunction with the movement of the housing, and including a first bending part bent from one end of the first region in a second direction opposite to the first direction and disposed to face a second lateral direction perpendicular to the first direction, and a first extension part extending from one end of the first bending part and disposed in parallel with the first region, and a second bending part bent from one end of the first extension part in the second direction and disposed to face a first lateral direction opposite to the second lateral direction.

A flexible display applied to an electronic device according to various example embodiments may include: a first region fixedly visible from outside through a first direction of the electronic device, a second region configured to be extended from one end of the first region and variably visible from the outside based on a change in a shape of the electronic device, and including a first bending part bent from one end of the first region in a second direction opposite to the first direction and disposed to face a second lateral direction perpendicular to the first direction, and a first extension part extending from one end of the first bending part and disposed in parallel with the first region, and a second bending part bent from one end of the first extension part in the second direction and disposed to face a first lateral direction opposite to the second lateral direction.

Various example embodiments of the disclosure may form a second bending part in a flexible display, thereby offsetting and/or reducing an internal stress causing a length deviation and/or slip between a plurality of layers, and reducing a lifting or warping phenomenon in at least a portion of the flexible display.

Various example embodiments of the disclosure may reduce a phenomenon that at least a portion of the flexible display is lifted or warped, thereby allowing the flexible display to easily slide with a small force, offering user convenience, and reducing driving power of the electronic device.

In addition, various effects explicitly or implicitly appreciated through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
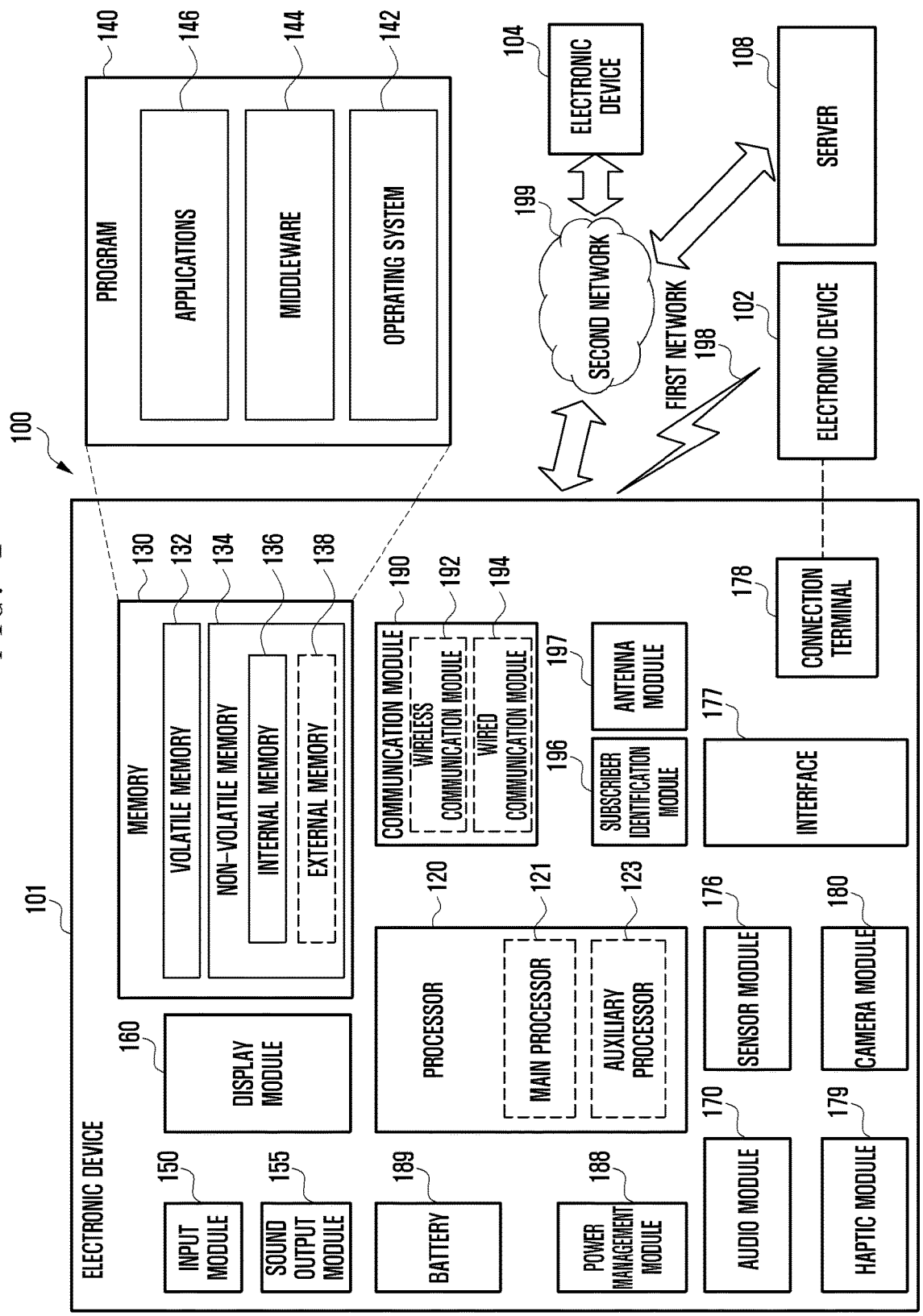
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
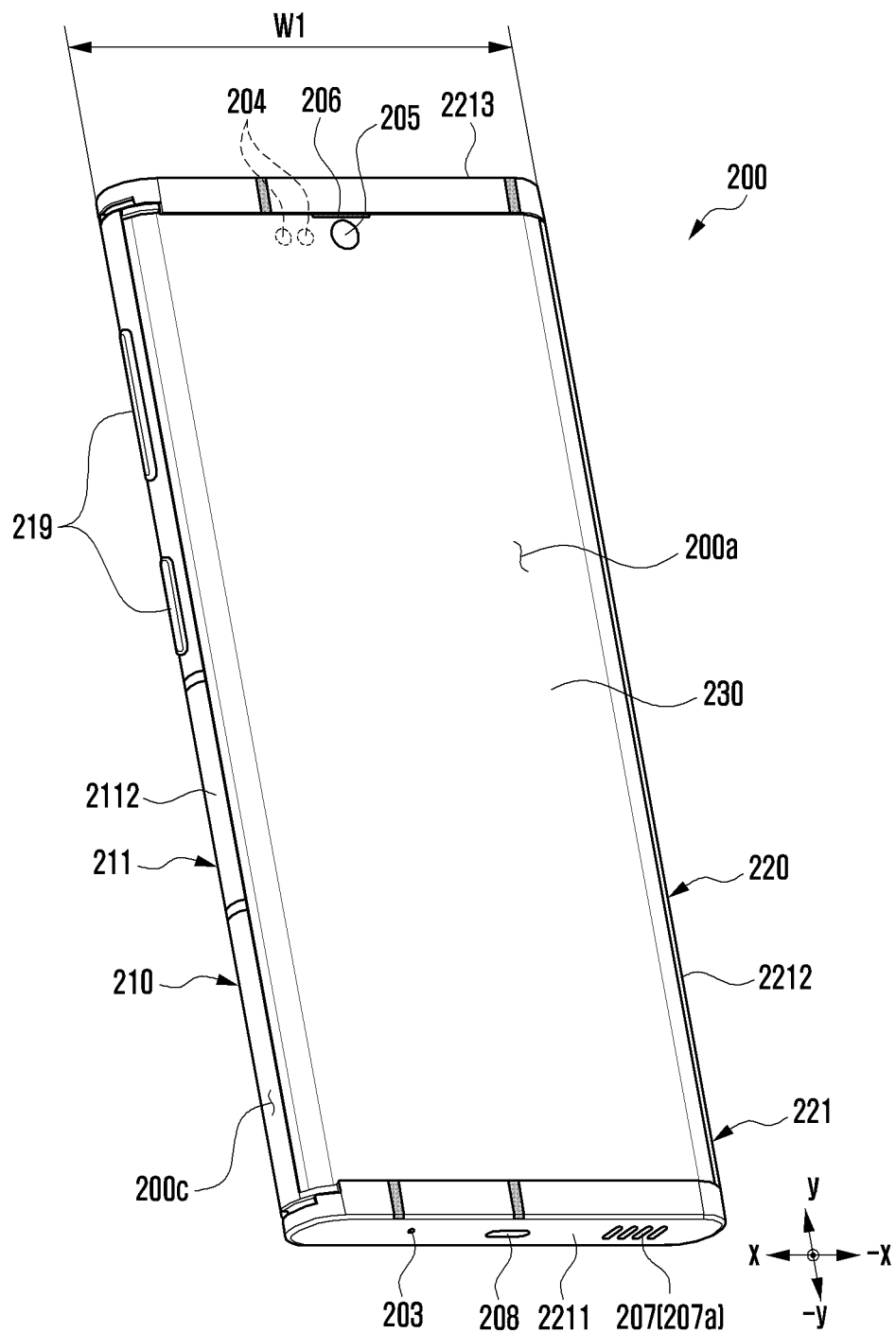
FIG. 2A is a front perspective view illustrating a front surface of an electronic device in a slide-in state according to various embodiments.
Figure 2B:
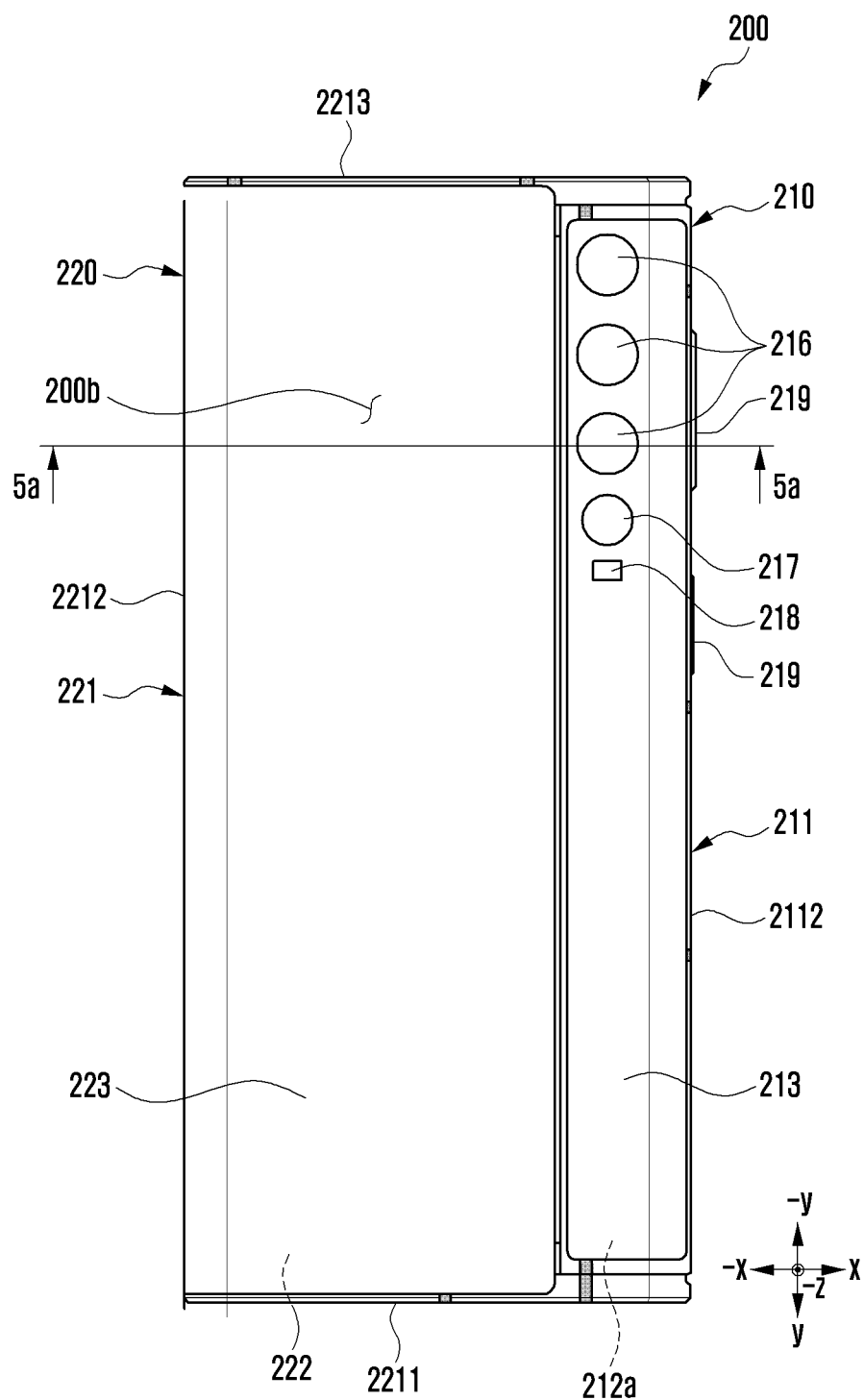
FIG. 2B is a diagram illustrating a rear surface of an electronic device in a slide-in state according to various embodiments.
Figure 3A:
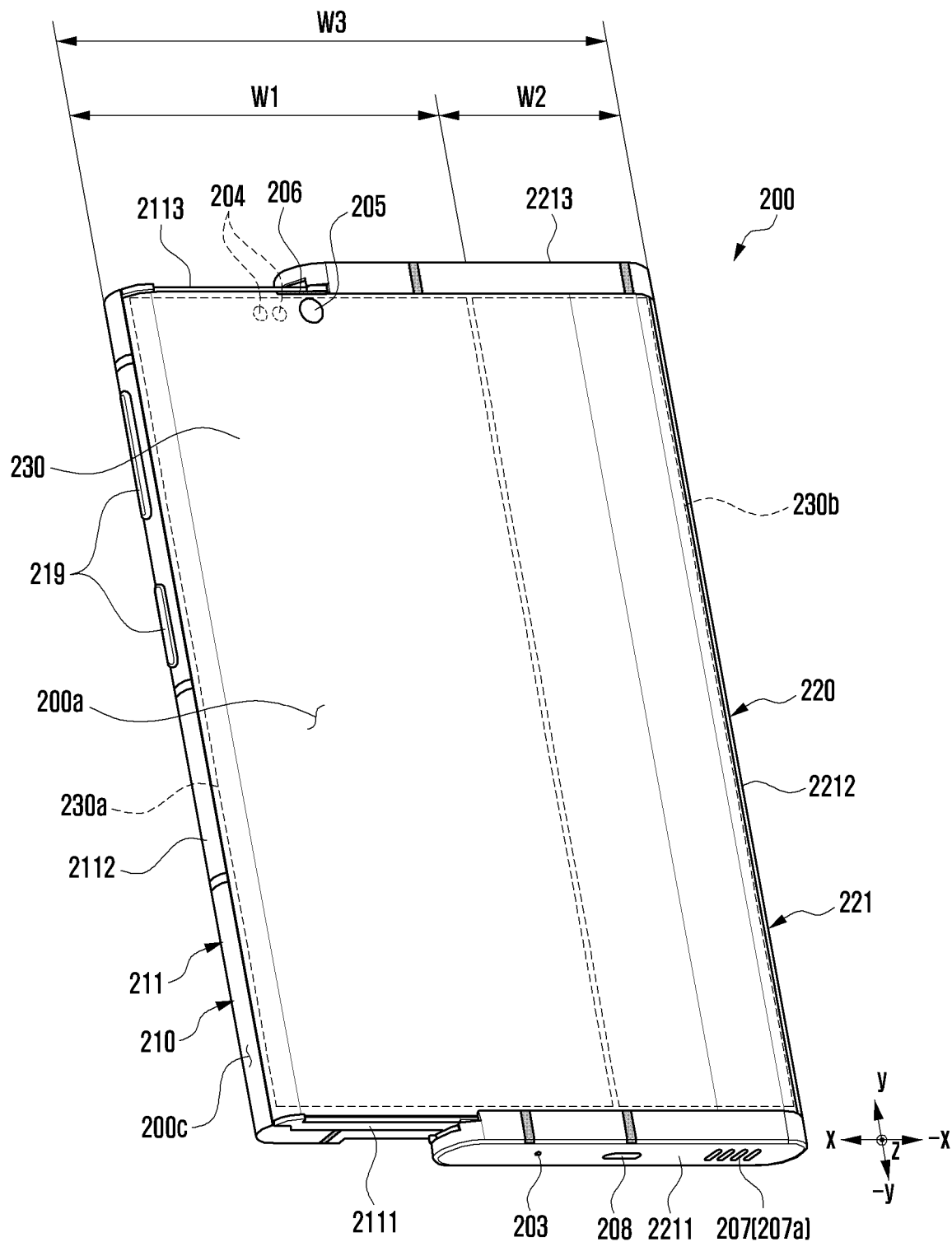
FIG. 3A is a front perspective view illustrating a front surface of an electronic device in a slide-out state according to various embodiments.
Figure 3B:
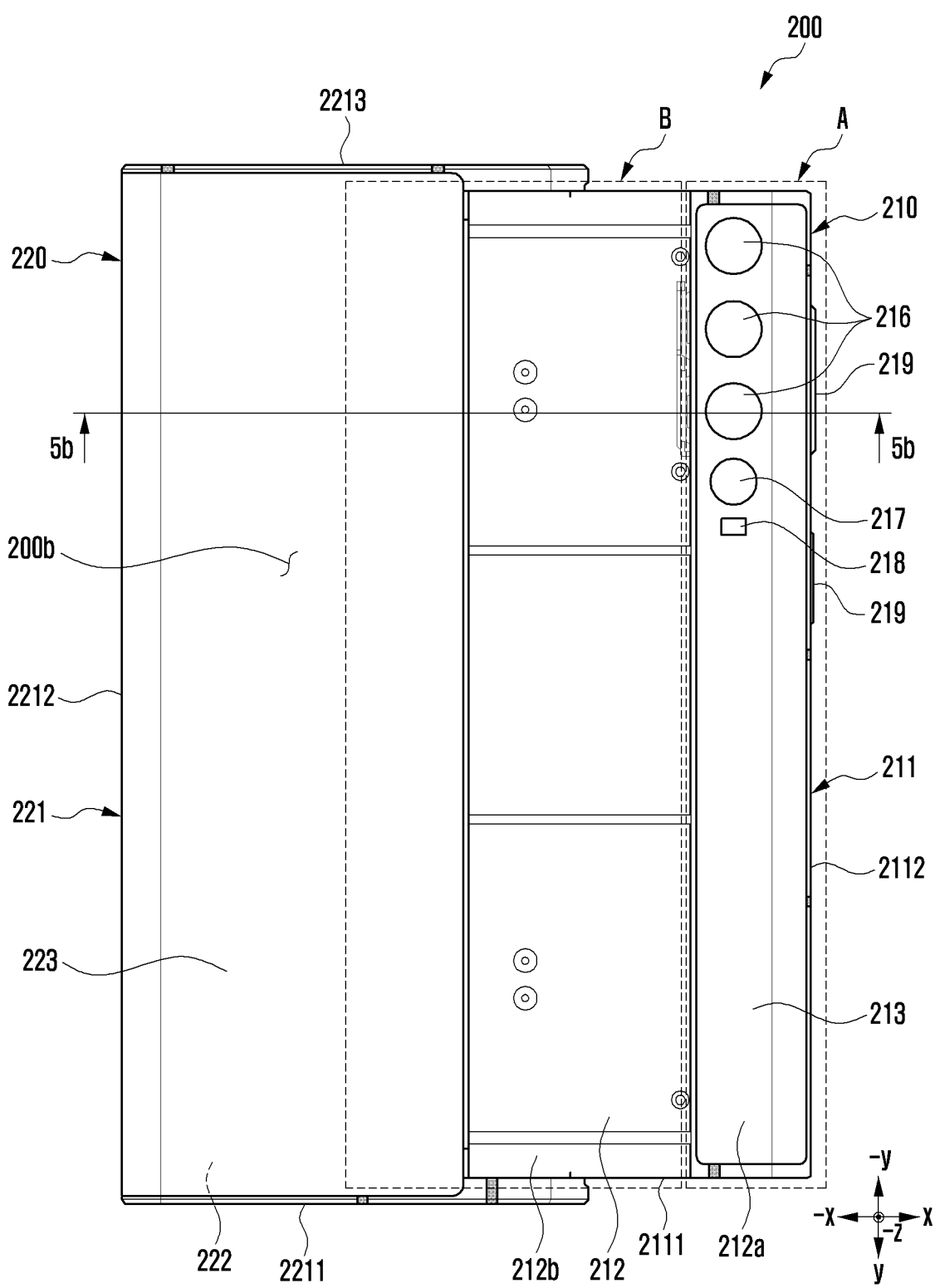
FIG. 3B is a diagram illustrating a rear surface of an electronic device in a slide-out state according to various embodiments.

FIGS. 2A and 2B are views illustrating a front surface and a rear surface of an electronic device in a slide-in state according to various embodiments. FIGS. 3A and 3B are views illustrating a front surface and a rear surface of an electronic device in a slide-out state according to various embodiments.

The electronic device 200 of FIGS. 2A, 2B, 3A and 3B may be similar at least in part to the electronic device 101 of FIG. 1 or may further include various embodiments of the electronic device.

Referring to FIGS. 2A, 2B, 3A and 3B, the electronic device 200 may include a first housing 210 (e.g., a first housing structure or a base housing), a second housing 220 (e.g., a second housing structure or a slide housing) combined with the first housing 210 to be movable in a designated first lateral direction (the x direction) by a designated reciprocating distance, and a flexible display 230 (e.g., an expandable display) disposed to be supported through at least a portion of the first and second housings 210 and 220. According to an embodiment, the electronic device 200 may include a bendable member or bendable support member (e.g., a bendable member 240 in FIG. 5A) (e.g., a multi-joint support structure) that forms at least in part the same plane as at least a portion of the first housing 210 in a slide-out state (or second state), and is accommodated at least in part in an inner space (e.g., a second space 2201 in FIG. 5A) of the second housing 220 in a slide-in state (or first state). According to an embodiment, in the slide-in state, at least a portion of the flexible display 230 may be disposed invisibly from the outside by being accommodated in the inner space (e.g., the second space 2201 in FIG. 5A) of the second housing 220 while being supported by the bendable member (e.g., the bendable member 240 in FIG. 5A). According to an embodiment, in the slide-out state, at least a portion of the flexible display 230 may be disposed to be visible from the outside while being supported by the bendable member (e.g., the bendable member 240 in FIG. 5A) that forms at least in part the same plane as the first housing 210.

According to various embodiments, the electronic device 200 may have a front surface 200a (e.g., a first surface), a rear surface 200b (e.g., a second surface) facing a direction opposite to the front surface 200a, and a lateral surface (not shown) surrounding a space between the front surface 200a and the rear surface 200b. According to an embodiment, the electronic device 200 may include the first housing 210 including a first lateral member 211 and the second housing 220 including a second lateral member 221. According to an embodiment, the first lateral member 211 may include a first lateral surface 2111 having a first length along the first lateral direction (the x direction), a second lateral surface 2112 extended from the first lateral surface 2111 to have a second length greater than the first length along a substantially perpendicular direction, and a third lateral surface 2113 extended from the second lateral surface 2112 substantially in parallel with the first lateral surface 2111 and having the first length. According to an embodiment, the first lateral member 211 may be formed of, at least in part, a conductive material (e.g., metal). According to an embodiment, the first lateral member 211 may include a first support member 212 extended to at least a portion of the inner space (e.g., a first space 2101 in FIG. 5A) of the first housing 210. For example, the first lateral member 211 may be formed integrally with the first support member 212. In another example, the first support member 212 may be formed separately from the first lateral member 211 and combined with the first lateral member 211.

According to various embodiments, the second lateral member 221 may include a fourth lateral surface 2211 corresponding at least in part to the first lateral surface 2111 and having a third length, a fifth lateral surface 2212 extended from the fourth lateral surface 2211 in a direction substantially parallel with the second lateral surface 2112 and having a fourth length greater than the third length, and a sixth lateral surface 2213 extended from the fifth lateral surface 2212 to correspond to the third lateral surface 2113 and having the third length. According to an embodiment, the second lateral member 221 may be formed of, at least in part, a conductive material (e.g., metal). According to an embodiment, at least a portion of the second lateral member 221 may include a second support member 222 extended to at least a portion of an inner space (e.g., a second space 2201 in FIG. 5) of the second housing 220. For example, the second lateral member 221 may be formed integrally with the second support member 222. In another example, the second support member 222 may be formed separately from the second lateral member 221 and combined with the second lateral member 221.

According to an embodiment, the first lateral surface 2111 and the fourth lateral surface 2211 and/or the third lateral surface 2113 and the sixth lateral surface 2213 may be slidably combined with each other. According to an embodiment, in the slide-in state, at least a portion of the first lateral surface 2111 overlaps with at least a portion of the fourth lateral surface 2211, thereby being disposed invisibly from the outside. According to an embodiment, in the slide-in state, at least a portion of the third lateral surface 2113 overlaps with at least a portion of the sixth lateral surface 2213, thereby being disposed invisibly from the outside. According to an embodiment, in the slide-in state, at least a portion of the first support member 212 may overlap with the second support member 222, and the other portion of the first support member 212 may be disposed to be visible from the outside. Therefore, the first support member 212 may include a non-overlapping portion 212a that does not overlap with the second support member 222 and an overlapping portion 212b that overlaps with the second support member 222 in the slide-in state. In various embodiments, the non-overlapping portion 212a and the overlapping portion 212b may be integrally formed. In various embodiments, the non-overlapping portion 212a and the overlapping portion 212b may be provided separately and structurally combined.

According to various embodiments, the first housing 210 may have, in the first space (e.g., the first space 2101 in FIG. 5A), a first sub-space A corresponding to the non-overlapping portion 212a and/or a second sub-space B corresponding to the overlapping portion 212b. According to an embodiment, the first sub-space A and the second sub-space B may be disposed to be connected at least in part to each other or separated from each other. According to an embodiment, the electronic device 200 may include a plurality of electronic components (e.g., a camera module 216, a sensor module 217, a flash 218, a main board (e.g., a main board 250 in FIG. 4), or a battery (e.g., a battery 251 in FIG. 4)) disposed in the first space (e.g., the first space 2101 in FIG. 5) of the first housing 210. According to an embodiment, the first sub-space A may be used, for example, as a region for disposing electronic components (e.g., the camera module 216, the sensor module 217, or the flash 218) that require a relatively large mounting space, require a relatively large mounting thickness, or need to operate while avoiding an overlapping structure. According to an embodiment, the second sub-space B may be used, for example, as a region for disposing electronic components (e.g., the main board 250 (e.g., a PCB) in FIG. 4 or the battery (e.g., the battery 251 in FIG. 4)) that require a relatively small mounting space, require a relatively small mounting thickness, or can operate regardless of an overlapping structure.

According to various embodiments, the front surface 200a and the rear surface 200b of the electronic device 200 may vary in area depending on the slide-in state or the slide-out state. In various embodiments, the electronic device 200 may include, in the rear surface 200b, a first rear cover 213 disposed on at least a portion of the first housing 210 and a second rear cover 223 disposed on at least a portion of the second housing 220. According to an embodiment, the first rear cover 213 and/or the second rear cover 223 may be disposed in a manner combined with at least a portion of the first and second support members 212 and 213. In various embodiments, the first rear cover 213 may be integrally formed with the first lateral member 211. In another example, the second rear cover 223 may be integrally formed with the second lateral member 221. According to an embodiment, the first rear cover 213 and/or the second rear cover 223 may be formed of a polymer, coated or colored glass, ceramic, metal (e.g., aluminum, stainless steel (STS), or magnesium), or any combination thereof. In various embodiments, the first rear cover 213 may be extended to at least a portion of the first lateral member 211. In various embodiments, the second rear cover 223 may be extended to at least a portion of the second lateral member 221. In various embodiments, the portion of the first rear cover 213 extended to the first lateral member 211 may be formed to have a curved surface. In various embodiments, the portion of the second rear cover 223 extended to the second lateral member 221 may be formed to have a curved surface. In various embodiments, at least a portion of the first support member 212 may be replaced with the first rear cover 213, and at least a portion of the second support member 222 may be replaced with the second rear cover 223.

According to various embodiments, the electronic device 200 may include the flexible display 230 disposed to be supported by at least a portion of the first and second housings 210 and 220. According to an embodiment, the flexible display 230 may include a first region 230a (e.g., a flat portion) that is always visible from the outside, and a second region 230b (e.g., a bendable portion) that is extended from the first region 230a and slides at least in part in the inner space (e.g., the first space 2201 in FIG. 5A) of the second housing 220 so as not to be visible from the outside in the slide-in state. According to an embodiment, the first region 230a may be disposed to be supported by the first housing 210, and the second region 230b may be disposed to be supported at least in part by a bendable member (e.g., the bendable member 240 in FIG. 5). According to an embodiment, in a state that the first housing 210 slides out along the designated first lateral direction (the x direction), at least a portion of the second region 230b of the flexible display 230 may be extended from the first region 230a while being supported by the bendable member (e.g., the bendable member 240 in FIG. 5A), form substantially the same plane as the first region 230a, and be disposed to be visible from the outside. According to an embodiment, in a state that the first housing 210 slides in along the designated second lateral direction (the −x direction), at least a portion of the second region 230b of the flexible display 230 may be introduced into the inner space (e.g., the second space 2201 in FIG. 5A) and disposed invisibly from the outside. Accordingly, in the electronic device 200, the display area of the flexible display 230 may vary as the first housing 210 moves in a sliding scheme along the designated direction from the second housing 220.

According to various embodiments, the first and second housings 210 and 220 may be operated in a sliding scheme so that the overall width is variable with respect to each other. According to an embodiment, the electronic device 200 may be configured to have a first width W1 from the second lateral surface 2112 to the fourth lateral surface 2212 in the slide-in state. According to an embodiment, in the slide-out state, the electronic device 200 may be configured to have a third width W3 greater than the first width W1 as a portion of the bendable member (e.g., the bendable member 240 in FIG. 5A) placed in the inner space (e.g., the second space 2201 in FIG. 5A) of the second housing 210 moves to have an additional second width W2. For example, the flexible display 230 may have a display area substantially corresponding to the first width W1 in the slide-in state, and have an extended display area substantially corresponding to the third width W3 in the slide-out state.

According to various embodiments, the slide-out operation of the electronic device 200 may be performed through a user's manipulation. For example, the electronic device 200 may be changed from the slide-in state to the slide-out state through an operation of the flexible display 230 being pushed in the first designated lateral direction (the x direction) by a user's manipulation. According to an embodiment, the electronic device 200 may be changed from the slide-out state to the slide-in state through an operation of the flexible display 230 being pushed in the second designated lateral direction (the −x direction) by a user's manipulation. According to an embodiment, the electronic device 200 may maintain the slide-out state and/or the slide-in state as the first housing 210 is pushed in the slide-in or slide-out direction (e.g., the first lateral direction, the x direction) based on a certain inflection point from the second housing 220 through a slide hinge module (e.g., a slide hinge module 260 in FIG. 4) disposed between the first housing 210 and the second housing 220. In various embodiments, the electronic device 200 may be configured such that the first housing 210 slides out in the first designated lateral direction (e.g., the x direction) through the manipulation of a locker exposed through the rear surface 200b of the electronic device 200. In various embodiments, the electronic device 200 may automatically operate through a driving mechanism (e.g., a driving motor, a reduction module, and/or a gear assembly) disposed in the inner space (e.g., the first space 2101 in FIG. 5A) of the first housing 210 and/or the inner space (e.g., the second space 2201 in FIG. 5A) of the second housing 220. According to an embodiment, the electronic device 200 may be configured to control the operation of the second housing 220 through the driving mechanism in response to detecting an event for a change between the slide-in/out states of the electronic device 200 through a processor (e.g., the processor 120 in FIG. 1). In various embodiments, the processor (e.g., the processor 120 in FIG. 1) of the electronic device 200 may also control the flexible display 230 to display an object in various manners and execute an application in response to the display area of the flexible display 230 varying according to the slide-in state, the slide-out state, or an intermediate state (e.g., a free stop state or a third state). For example, the intermediate state may refer to a state between the slide-in state and the slide-out state. In one example, the intermediate state may be a state where the slide-in state is being changed to the slide-out state. In another example, the intermediate state may be a state where the slide-out state is being changed to the slide-in state.

According to various embodiments, the electronic device 200 may include at least one of an input device 203, sound output devices 206 and 207, sensor modules 204 and 217, camera modules 205 and 216, a connector port 208, a key input device 219, or an indicator (not shown). In another embodiment, the electronic device 200 may be configured to omit at least one of the above-described components or to further include other components.

According to various embodiments, the input device 203 may include a microphone. In various embodiments, the input device 203 may include a plurality of microphones disposed to detect the direction of a sound. The sound output devices 206 and 207 may include speakers. The sound output devices 206 and 207 may include a call receiver 206 and an external speaker 207. According to an embodiment, the external speaker 207 may be disposed in the second housing and configured to transmit a sound to the outside through a first speaker hole 207a. According to an embodiment, the external speaker 207 may be disposed in the inner space (e.g., the second space 2201 in FIG. 5A) of the second housing 220, thereby providing a high-quality sound to a user regardless of the sliding operation of the first housing 210. According to an embodiment, the connector port 208 may be disposed in the inner space (e.g., the inner space 2201 in FIG. 5A) of the second housing 220 together with the external speaker 207. In various embodiments, the connector port 208 may be disposed in the inner space of the first housing 210 and, in the slide-in state, may face the outside through a connector port hole (not shown) formed in the second housing 220. In this case, in the slide-in state, the connector port 208 may be configured to be covered by the second housing 220 so as not to be visible from the outside. According to an embodiment, the receiver 206 may be configured to meet the external environment in the inner space (e.g., the first space in FIG. 5A) of the first housing 210. In this case, the first housing may include a sound emission hole (not shown). According to an embodiment, the sound emission hole (not shown) may be covered by at least a portion of the second housing 220 so as not to be visible from the outside while maintaining the sound emission performance. In various embodiments, the sound output devices 206 and 207 may include a speaker (e.g., a piezo speaker) that operates without a separate speaker hole.

According to various embodiments, the sensor modules 204 and 217 may generate an electrical signal or data value corresponding to an internal operating state of the electronic device 200 or an external environmental state. The sensor modules 204 and 217 may include, for example, a first sensor module 204 (e.g., a proximity sensor or an illuminance sensor) disposed on the front surface 200a of the electronic device 200 and/or a second sensor module 217 disposed on the rear surface 200b. According to an embodiment, the first sensor module 204 may be disposed under the flexible display 230 on the front surface 200a of the electronic device 200. According to an embodiment, the first sensor module 204 and/or the second sensor module 217 may include at least one of a proximity sensor, an illuminance sensor, a time of flight (TOF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various embodiments, the camera modules 205 and 216 may include a first camera module 205 disposed on the front surface 200a of the electronic device 200 and a second camera module 216 disposed on the rear surface 200b of the electronic device 200. According to an embodiment, the electronic device 200 may include a flash 218 positioned near the second camera module 216. According to an embodiment, the camera modules 205 and 216 may include one or more lenses, an image sensor, and/or an image signal processor. According to an embodiment, the first camera module 205 may be disposed under the flexible display 230 and configured to photograph a subject through a portion of an active region of the flexible display 230. According to an embodiment, the flash 218 may include, for example, a light emitting diode or a xenon lamp.

According to various embodiments, the first camera module 205 of the camera modules 205 and 216 and/or some sensor modules 204 of the sensor modules 204 and 217 may be disposed in the inner space (e.g., the first space 2101 in FIG. 5A) of the electronic device 200 so as to be in contact with the external environment through a perforated opening or transmissive region of the flexible display 230. According to an embodiment, a region of the flexible display 230 facing the first camera module 205 is a part of an area displaying content and may be formed as the transmissive region having a specified transmittance. According to an embodiment, the transmissive region may be formed to have a transmittance ranging from about 5% to about 20%. The transmissive region may include a region that overlaps with an effective area (e.g., an angle-of-view area) of the first camera module 205 through which light for generating an image on the image sensor passes. For example, the transmissive region of the flexible display 230 may include a region having a lower pixel density and/or wiring density than the surrounding region. For example, the transmissive region may replace the aforementioned opening. For example, some camera modules 205 may include an under display camera (UDC). In various embodiments, some sensor modules 204 may be disposed to perform their functions without being visually exposed through the flexible display 230 in the inner space of the electronic device 200. According to an embodiment, the second camera module 216 of the camera modules 205 and 216 and/or some of the sensor modules 217 of the sensor modules 204 and 217 may be disposed in the inner space (e.g., the first space 2101 in FIG. 5A) of the electronic device 200 so as to be in contact with the external environment through at least a portion (e.g., the first rear cover 213) of the first housing. In this case, the second camera module and/or some sensor modules 217 may be disposed at a designated position of the first housing 210 that is always viewed from the outside regardless of the slide-in state and/or the slide-out state.

Figure 4:
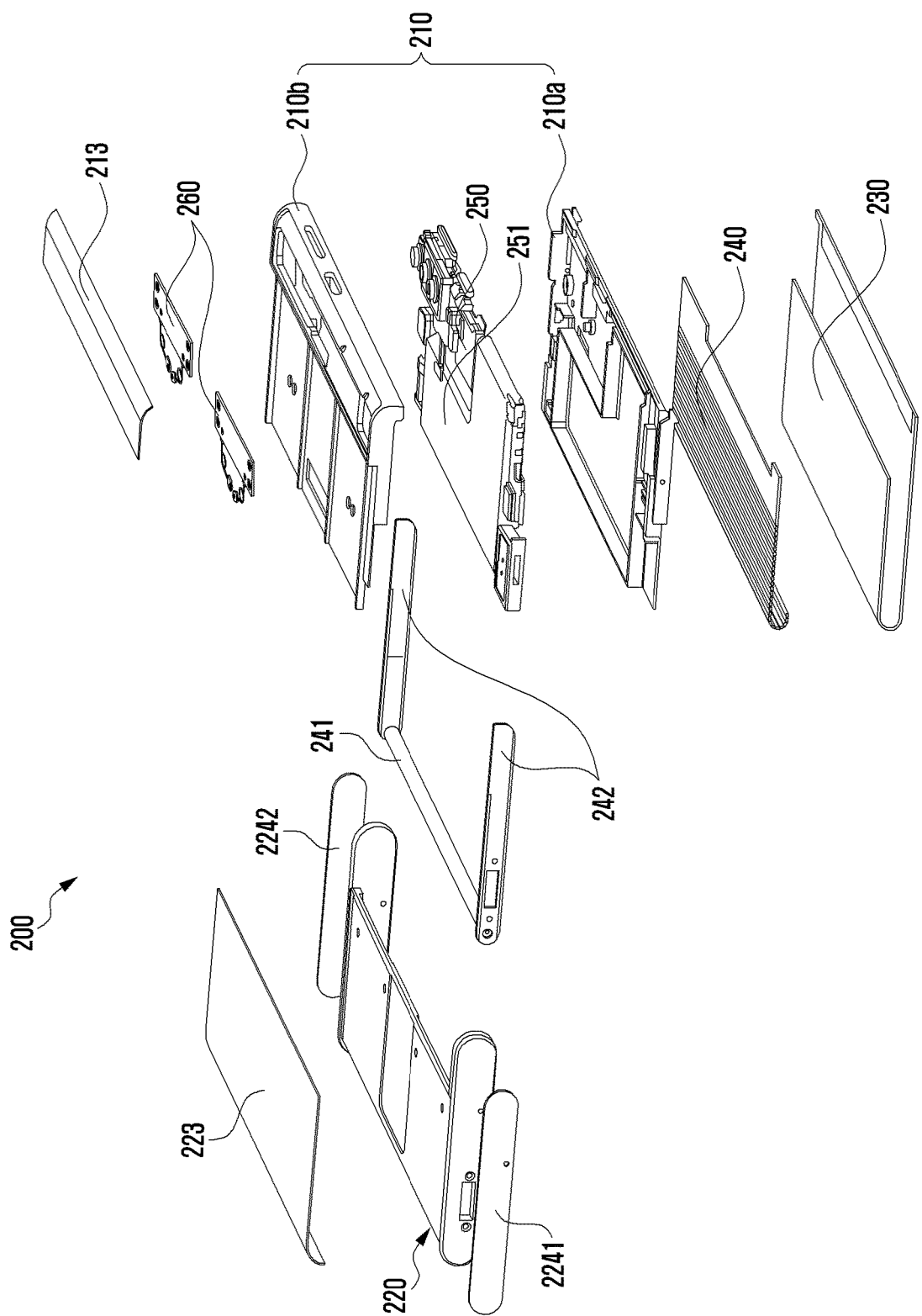
FIG. 4 is an exploded perspective view illustrating an electronic device according to various embodiments.

FIG. 4 is an exploded perspective view illustrating an electronic device according to various embodiments.

Referring to FIG. 4, the electronic device 200 may include the first housing 210 having the first space (e.g., the first space 2101 in FIG. 5A), the second housing 220 slidably combined with the first housing 210 and having the second space (e.g., the second space 2201 in FIG. 5A), the bendable member 240 disposed to be rotatably at least in part in the second space (e.g., the second space 2201 in FIG. 5A), the flexible display 230 disposed to be supported by at least a portion of the bendable member 240 and the first housing 210, and at least one slide hinge module 260 for pushing the first housing 210 in the slide-in direction (e.g., the second lateral direction, the −x direction) and/or the slide-out direction (e.g., the first lateral direction, the x direction) from the second housing 220. According to an embodiment, the first space (e.g., the first space 2201 in FIG. 5A) of the first housing 210 may be provided through coupling of a first bracket housing 210a (e.g., a front bracket housing) and a second bracket housing 210b (e.g., a rear bracket housing). In various embodiments, at least a portion of the first bracket housing 210a and/or the second bracket housing 210b may include at least a portion of the first lateral member 211 or the first support member (e.g., the first support member 212 in FIG. 3B) or may be replaced with the first support member 212. According to an embodiment, the electronic device 200 may include a main substrate 250 disposed in the first space (e.g., the first space 2201 in FIG. 5A). According to an embodiment, the electronic device 200 may include a camera module (e.g., the camera module 216 in FIG. 3B) or a sensor module (e.g., the sensor module 217 in FIG. 3B) disposed in the first space (e.g., the first space 2101 in FIG. 5A). According to an embodiment, the bendable member 240 may have one end fixed to the first housing 210 and the other end disposed to be accommodated rotatably at least in part in the second space (e.g., the second space 2201 in FIG. 5A) of the second housing 220. According to an embodiment, the bendable member 240 may include a plurality of multi-bars rotatably connected to each other. According to an embodiment, the bendable member 240 may be supported through a shaft-shaped support member 241 disposed in the second space (e.g., the second space 2201 in FIG. 5A). According to an embodiment, the support member 241 (e.g., the support member 241 in FIG. 5A) may include a support roller rotatably disposed in the second space. In various embodiments, the electronic device 200 may include a tension providing member that is disposed in the inner space (e.g., the second space 2201 in FIG. 5A) of the electronic device 200 and supports the rear surface of the bendable member 240, thereby providing a tension to prevent and/or reduce sagging of the flexible display 230 during movement. According to an embodiment, the tension providing member may include a metal tension belt.

According to various embodiments, the bendable member 240 may be accommodated at least in part in the second space (e.g., the second space 2201 in FIG. 5A) in the slide-in state, and drawn out at least in part from the second space (e.g., the second space 2201 in FIG. 5A) in the slide-out state so as to form substantially the same plane as the first housing 210. Therefore, the flexible display 230 supported by the first housing 210 and the bendable member 240 may vary in the display area according to a sliding operation. According to an embodiment, the electronic device 200 may further include guide rails 242 disposed on the sides of the combined first and second bracket housings 210a and 210b and guided in the inner space (e.g., the second space 2201 in FIG. 5) of the second housing 220. In various embodiments, the electronic device 200 may include one or more cover members 2241 and 2242 disposed on both sides of a second support member (e.g., the second support member 222 in FIG. 3B) of the second housing 220. According to an embodiment, the one or more cover members 2241 and 2242 may include a first cover member 2241 disposed to cover at least in part a fourth lateral surface (e.g., the fourth lateral surface 2211 in FIG. 2A) of the second housing 220, and a second cover member 2242 disposed to cover at least in part a sixth lateral surface (e.g., the sixth lateral surface 2213 in FIG. 2A) of the second housing 220.

Figure 5A:
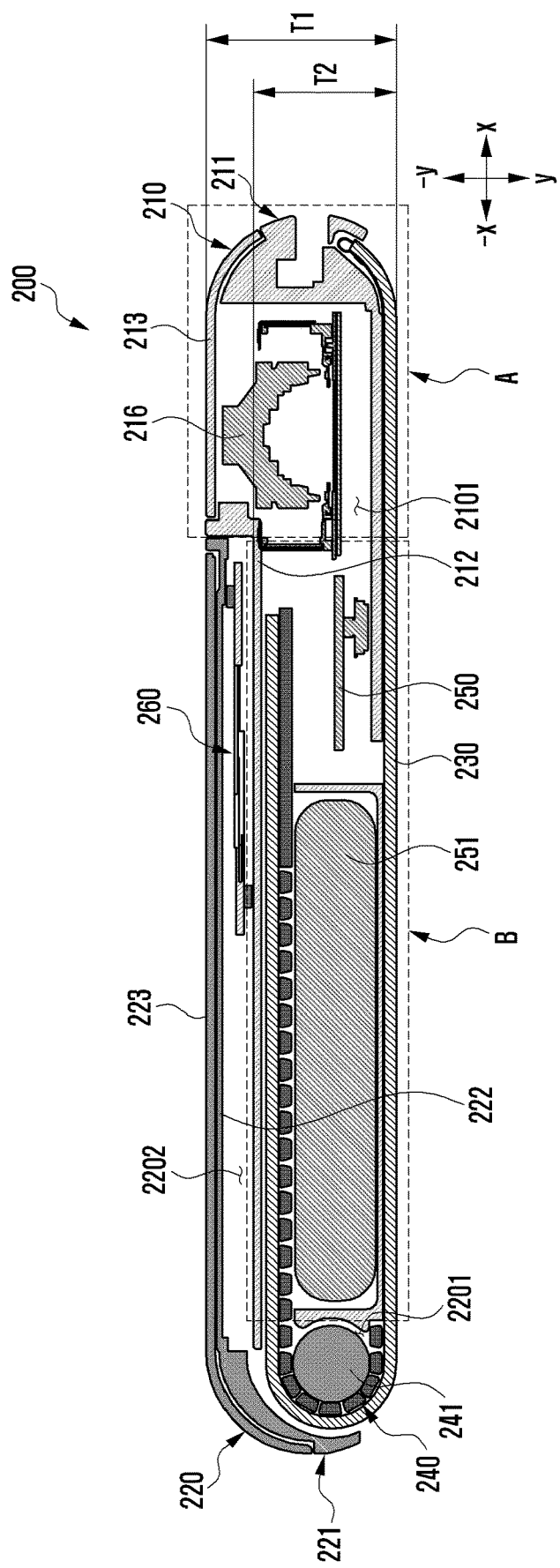
FIG. 5A is a cross-sectional view illustrating an electronic device taken along the line 5a-5a of FIG. 2B according to various embodiments.
Figure 5B:
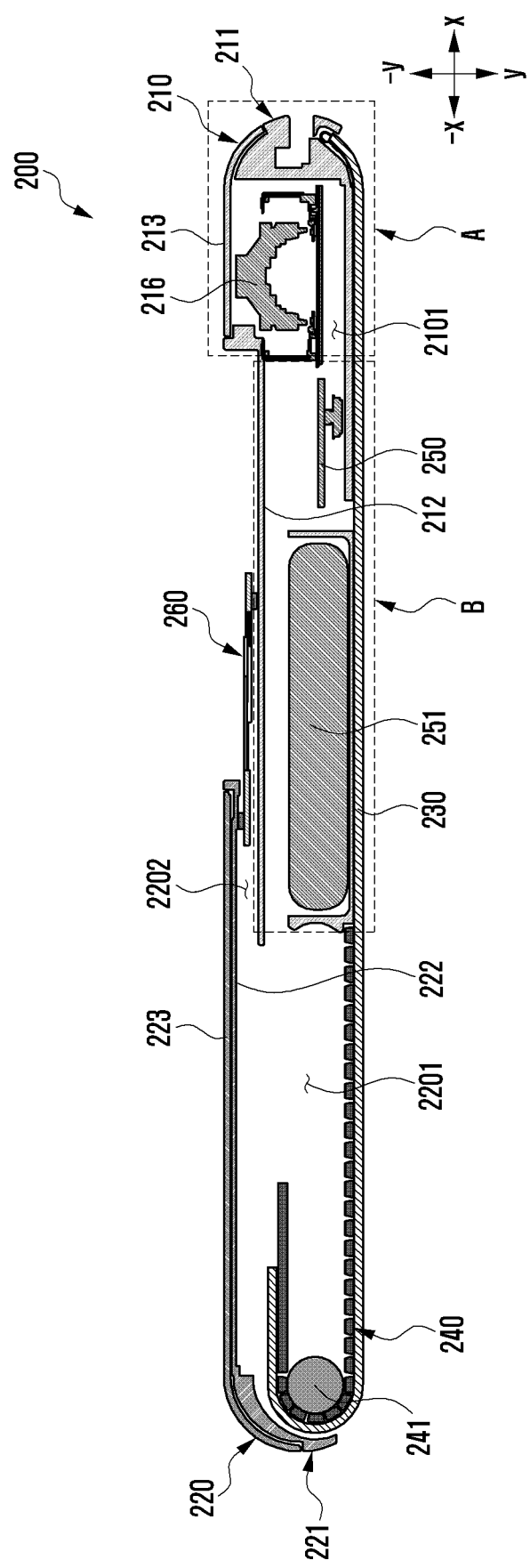
FIG. 5B is a cross-sectional view illustrating an electronic device taken along the line 5b-5b of FIG. 3B according to various embodiments.

FIG. 5A is a cross-sectional view illustrating an electronic device taken along the line 5a-5a of FIG. 2B according to various embodiments. FIG. 5B is a cross-sectional view illustrating an electronic device taken along the line 5b-5b of FIG. 3B according to various embodiments.

Referring to FIGS. 5A and 5B, the electronic device 200 may include the first housing 210 having the first space 2101, the second housing 220 having the second space 2201, the bendable member 240 accommodated at least in part in the second space 2201 in the slide-in state, the flexible display 230 disposed to be supported by at least a portion of the bendable member 240 and at least a portion of the first housing 210, and the slide hinge module 260 disposed in a third space 2202 between the first and second housings 210 and 220 and pushing the first housing 210 in the slide-out direction (e.g., the first lateral direction, the x direction) and/or the slide-in direction (e.g., the second lateral direction, the −x direction) from the second housing 220. According to an embodiment, the electronic device 200 may include a plurality of electronic components. According to an embodiment, the plurality of electronic components may be disposed in the first space 2101 of the first housing 210. According to an embodiment, the first space 2101 may include a first sub-space A and a second sub-space B connected to the first sub-space A.

According to various embodiments, among the plurality of electronic components, first electronic components that require a relatively large mounting space, require a relatively large mounting thickness T1 of the electronic device 200, or need to operate by avoiding an overlapping structure of the two housings 210 and 220 may be disposed in the first sub-space A. According to an embodiment, the first electronic components may include the camera module 216 and the sensor module (e.g., the sensor module 217 or the flash 218 in FIG. 3B). In this case, at least some of the first electronic components may be disposed to face the external environment through the first support member 212 and/or the first rear cover 213. According to an embodiment, among the plurality of electronic components, second electronic components that require a relatively small mounting space, require a relatively small mounting thickness T2 of the electronic device 200, can operate regardless of the overlapping structure of the two housings 210 and 220 may be disposed in the second sub-space B. According to an embodiment, the second electronic components may include the main board 250 and/or the battery 251. In various embodiments, when the first sub-space A and the second sub-space B are connected to each other, some electronic components (e.g., the main board 250 or FPCB) among the plurality of electronic components may be disposed together in both sub-spaces.

According to various embodiments, on the rear surface (e.g., the rear surface 200b in FIG. 3B) of the electronic device 200, the at least one slide hinge module 260 may be disposed in the third space 2202 between the first support member 212 of the first housing 210 and the second support member 222 of the second housing 220. According to an embodiment, the third space 2202 may be formed in a structure that is partially separated from the second space 2201 through at least a portion of the first housing 210 in the slide-in state and is at least partially connected to the second space 2201 in the slide-out state. According to an embodiment, the at least one slide hinge module 260 may include an elastic member (e.g., a torsion spring) that provides an elastic force for pushing the first housing 210, based on a designated inflection point, from the second housing 220 in the slide-out direction (e.g., the first lateral direction, the x direction) and/or in the slide-in direction (e.g., the second lateral direction, the −x direction). For example, when the flexible display 230 is pushed in the slide-out direction (e.g., the first lateral direction, the x direction) through a user's manipulation and moved beyond the inflection point, the electronic device 200 may be continuously pushed to maintain the slide-out state through the slide hinge module 260. According to an embodiment, when the flexible display 230 is pushed in the slide-in direction (e.g., the second lateral direction, the −x direction) through a user's manipulation and moved beyond the inflection point, the electronic device 200 may be continuously pushed to maintain the slide-in state through the slide hinge module 260.

According to embodiments of the disclosure, the electronic components of the electronic device 200 can be appropriately arranged in the sub-spaces A and B having different shapes in the first space 2101 of the first housing 210, so that such an efficient arrangement structure can help to slim down the electronic device 200 and improve performance. In addition, because the first housing 210 is pushed from the second housing 220 through the slide hinge module 260, based on the designated inflection point, in the slide-out direction (e.g., the first lateral direction, the x direction) and/or the slide-in direction (e.g., the second lateral direction, the −x direction), improved operation convenience can be provided.

Figure 9:
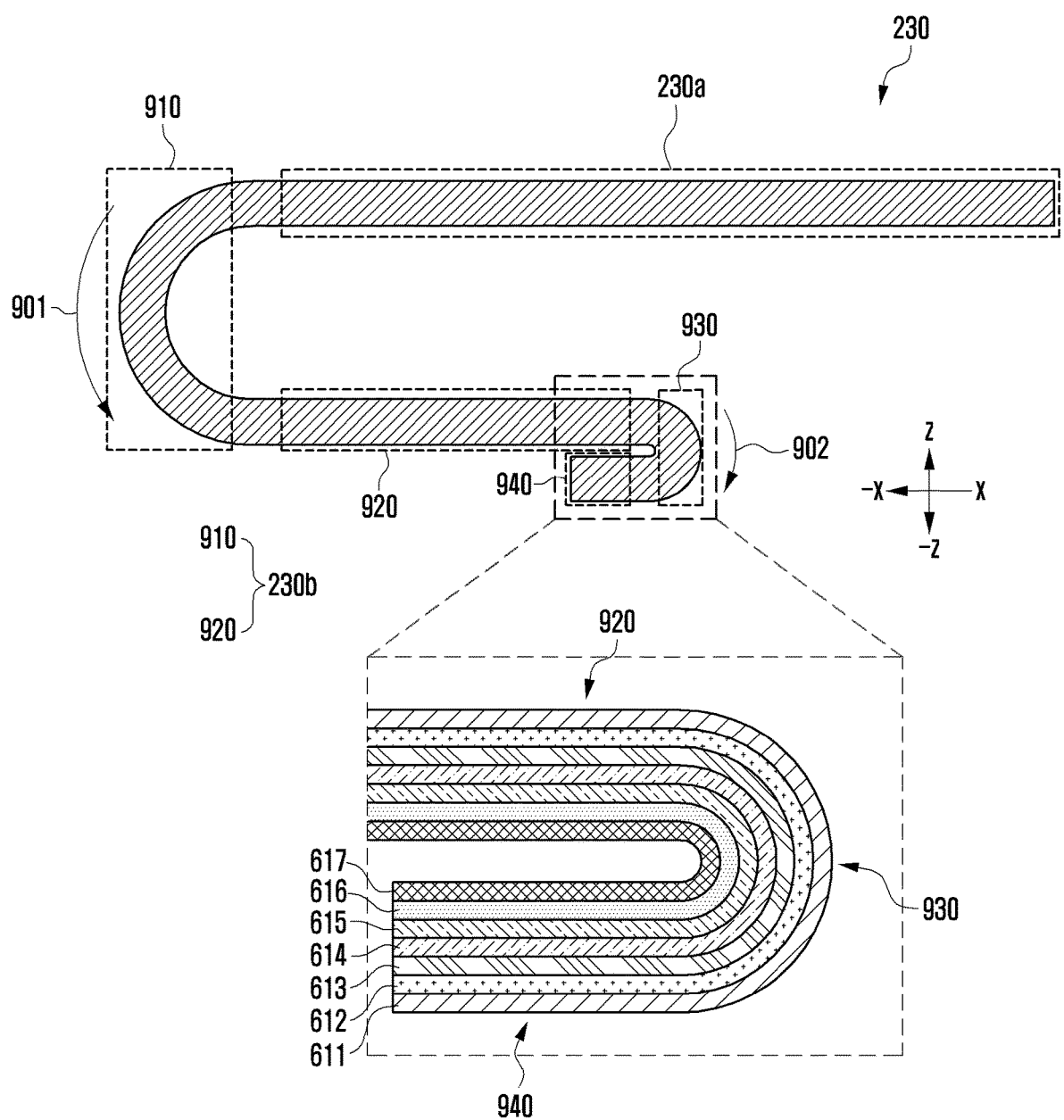
FIG. 9 is a cross-sectional view illustrating an example structure of a flexible display according to various embodiments.

According to various embodiments, the flexible display 230 may further include a second bending part (not shown) (e.g., a second bending part 930 in FIG. 9) and a second extension part (not shown) (e.g., a second extension part 940 in FIG. 9). According to an embodiment, by further including the second bending part 930 and the second extension part 940, the flexible display 230 can offset an internal stress causing a length deviation and/or slip between a plurality of layers of the flexible display 230, and also reduce a phenomenon that at least a portion of the flexible display 230 is lifted or warped. In the disclosure, the flexible display 230 further including the second bending part 930 and the second extension part 940 and the electronic device 200 including the same will be described in greater detail below with reference to FIGS. 9, 10A, 10B, 11, 12, 13, 14, 15 and 16.

Figure 6:
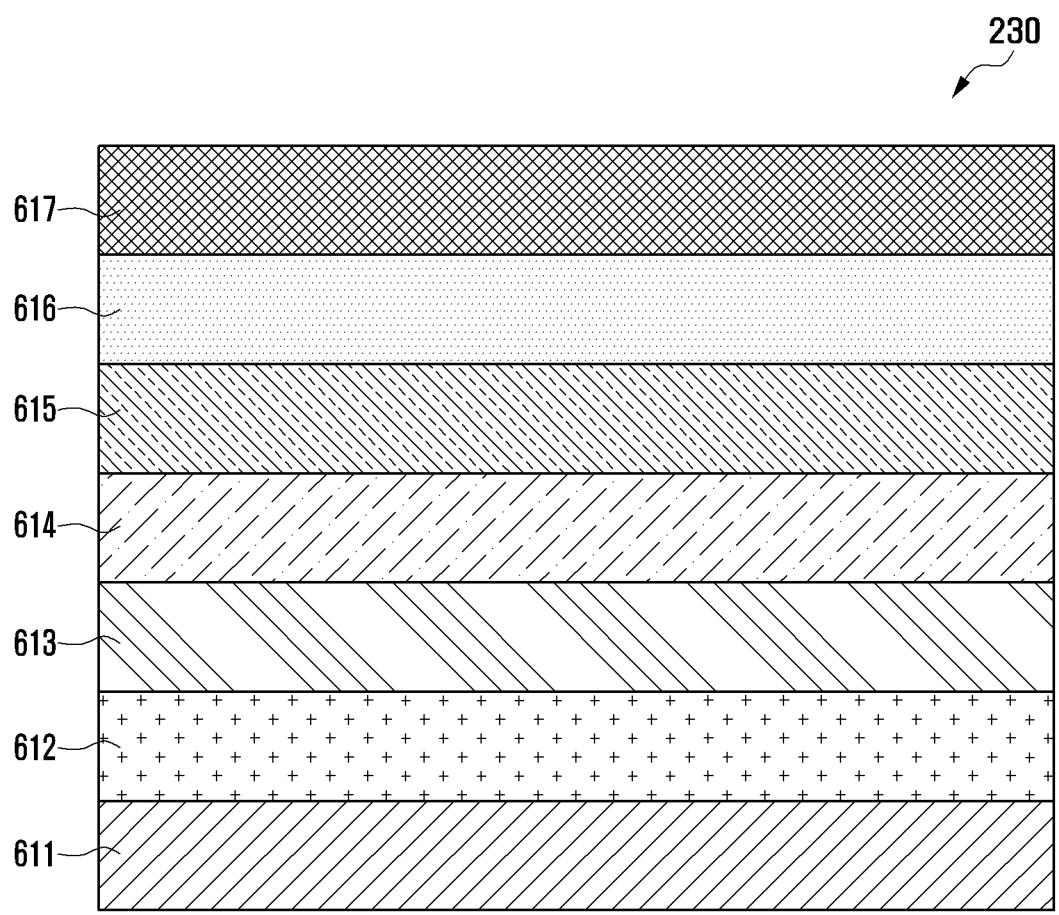
FIG. 6 is a cross-sectional view illustrating a stack structure of a flexible display according to various embodiments.

FIG. 6 is a cross-sectional view illustrating a stack structure of a flexible display 230 according to various embodiments.

The flexible display 230 illustrated in FIG. 6 may be similar at least in part to the flexible display 230 illustrated in FIGS. 2A, 2B, 3A, 3B, 4, 5A and 5B or may include any embodiment. Hereinafter, with reference to FIG. 6, features of the flexible display 230 that have not been described above or different from the above description will be mainly described.

Referring to FIG. 6, the flexible display 230 (e.g., the flexible display 230 in FIG. 2A) according to various embodiments may include a metal plate 611, a polymer member 612 disposed on the metal plate 611, a protection member 613 disposed on the polymer member 612, a display panel 614 disposed on the protection member 613, a polarization layer 615 disposed on the display panel 614, a glass layer 616 disposed on the polarization layer 615, and/or a polymer layer 617 disposed on the glass layer 616, which may be attached to each other by an adhesive member (not shown). According to an embodiment, the adhesive member may include at least one of an optical clear adhesive (OCA), a pressure sensitive adhesive (PSA), a heat-reactive adhesive, a normal adhesive, and a double-sided tape.

According to an embodiment, the display panel 614 may include an organic light emitting diode (OLED). For example, it may include an unbreakable (UB) type OLED display (e.g., a curved display), but is not limited thereto.

According to an embodiment, the polarization layer 615 may block reflected light of the display panel 614 to improve outdoor visibility. According to an embodiment, the display may not include a polarizer (POL) (e.g., a circular polarizer, retarder), and may include a color filter layer for a color filter on encapsulation (COE) scheme. In this embodiment, the color filter layer may improve the outdoor visibility by blocking the reflected light of the display panel 614 instead of the function of the polarization layer 615.

According to an embodiment, the glass layer 616 may include ultra-thin glass (UTG).

According to an embodiment, the polymer layer 617 may include polyethylene terephthalate (PET) or polyimide.

According to an embodiment, the protection member 613 (e.g., a patterned film) may be member for fixing the display panel 614 or protecting the display panel 614 in a process of forming a plurality of elements (e.g., thin film transistors (TFTs)) and/or OLEDs of the display panel 614. According to an embodiment, the protection member 613 may include polyethylene terephthalate (PET).

According to an embodiment, a dark color (e.g., black) may be applied to the polymer member 612 to help display the background when the flexible display 230 is turned off. According to an embodiment, the polymer member 612 may include a cushion member for reducing the damage of the flexible display 230 by absorbing an impact from the outside of the electronic device 200 (e.g., the electronic device 200 in FIG. 2).

According to an embodiment, the metal plate 611 may help to reinforce the rigidity of the electronic device 200, shield ambient noise, and be used to dissipate heat emitted from nearby heat-generating components. According to an embodiment, the metal plate 611 may include at least one of steel use stainless (SUS) (e.g., stainless steel (STS)), Cu, Al, or CLAD (e.g., a stacked member in which SUS and Al are alternately disposed). According to an embodiment, the metal plate 611 may include a lattice structure having slits (not shown) formed in a portion corresponding to the second region 230b of the flexible display 230.

According to various embodiments, the flexible display 230 may further include at least one functional member (not shown) disposed between the polymer member 612 and the metal plate 611. According to an embodiment, the functional member may include a graphite sheet for heat dissipation, a force-touch FPCB, a fingerprint sensor FPCB, an antenna radiator for communication, a heat dissipation sheet, a conductive/non-conductive tape, and/or a detection member (e.g., a digitizer) for detecting an input from a writing member of an electromagnetic induction type.

According to various embodiments, as will be described in greater detail below with reference to FIGS. 9 and 14, the flexible display 230 may include a bending part (e.g., the first bending part 910 and the second bending part 930 in FIG. 9). According to an embodiment, the polymer layer 617 of the flexible display 230 may form an outermost layer of the flexible display 230 in the bending part. For example, the polymer layer 617 of the flexible display 230 may form the outermost layer in the first bending part 910 (e.g., the first bending part 910 in FIG. 9).

Figure 7:
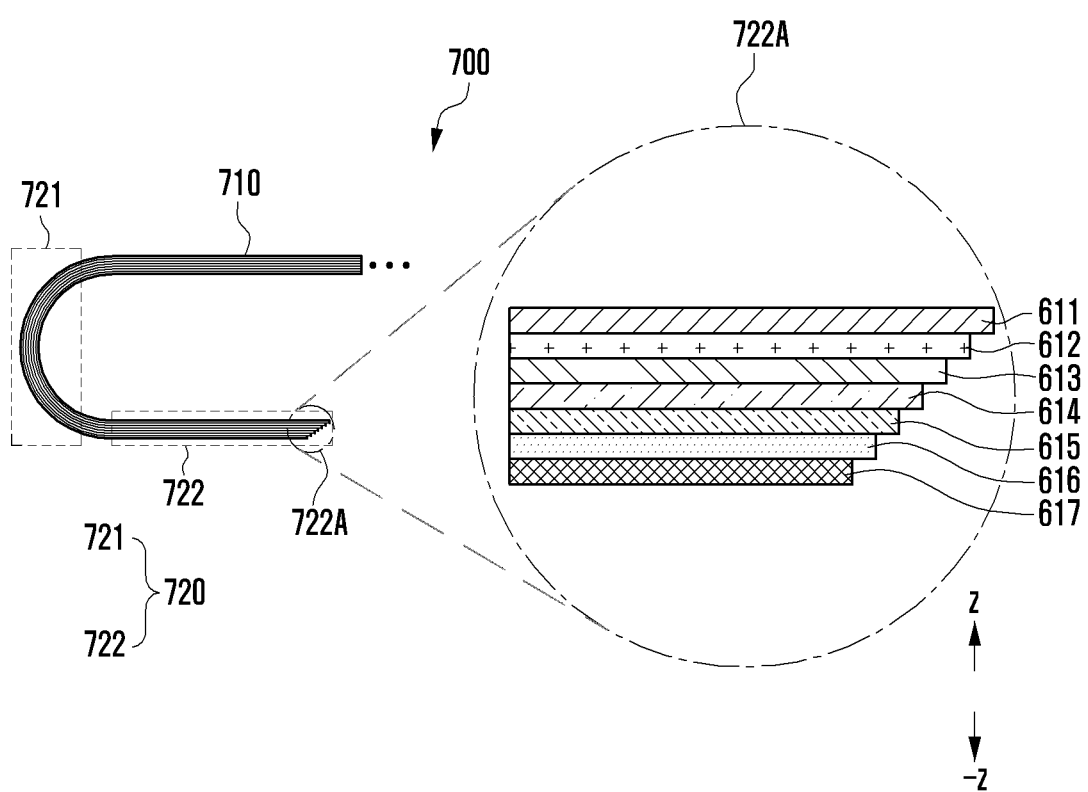
FIG. 7 is a cross-sectional view illustrating a structure of a flexible display according to a comparative example.
Figure 8:
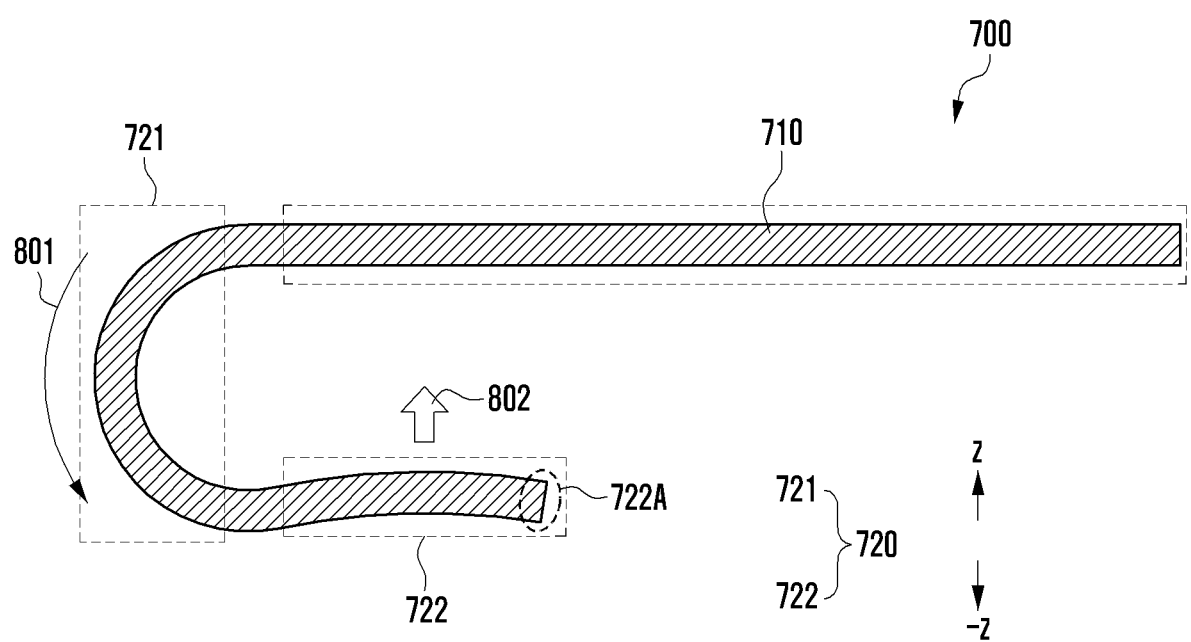
FIG. 8 is a diagram illustrating an example of a lifting phenomenon of a flexible display according to a comparative example.

FIG. 7 is a cross-sectional view illustrating a structure of a flexible display according to a comparative example. FIG. 8 is a diagram illustrating an example of a lifting phenomenon of a flexible display according to a comparative example.

Referring to FIGS. 7 and 8, a flexible display 700 according to a comparative example may include a stack structure similar at least in part to or identical to that of the flexible display 700 illustrated in FIG. 6.

In the comparative example, the flexible display 700 may include a first region 710 fixedly visible from the outside through a first direction (the z direction) of the electronic device 200, and a second region 720 extended from one end of the first region 710 and variably visible from the outside in conjunction with the movement of the housing.

In the comparative example, the second region 720 of the flexible display 700 may include a bending part 721 bent from one end of the first region 710 in a second direction (the −z direction) opposite to the first direction (the z direction) and thereby disposed to face a second lateral direction (the −x direction) perpendicular to the first direction (the z direction), and an extension part 722 extended from one end of the bending part 721 and disposed in parallel with the first region 710. For example, the second lateral direction (−x) may be a slide-in direction of the first housing from the second housing 220.

In the comparative example, because the flexible display 700 is configured such that at least a portion is bent, length deviations and/or slips among the plurality of layers 611, 612, 613, 614, 615, 616, and 617 may occur at one end of the flexible display 700. For example, as shown in FIG. 7, the respective layers are different in the radius of curvature at the bending part 721, so that the plurality of layers 611, 612, 613, 614, 615, 616, and 617 of a stack structure of the flexible display 700 may be different in the degree of protrusion at one end 722A of the extension part 722. For example, in the bending part 721 where the flexible display 700 is bent, the polymer layer 617 forming the outermost layer of the flexible display 700 may require a greater radius of curvature than that of the metal plate 611 forming the innermost larger. Thus, at one end 722A of the extension part 722, the polymer layer 617 forming the outermost layer of the display 700 may protrude the least, and the metal plate 611 forming the innermost layer of the display 700 may protrude the most. For example, at one end 722A of the extension part 722, the metal plate 611 may protrude more than the polymer layer 617.

In the comparative example, the plurality of layers 611, 612, 613, 614, 615, 616, and 617 may be attached to each other by an adhesive member (or an attaching member). In the comparative example, when the flexible display 700 is bent while the plurality of layers 611, 612, 613, 614, 615, 616, and 617 are attached to each other, a phenomenon that a portion of the flexible display 700 is lifted or warped due to internal stress generating a slip may occur. For example, when the flexible display 700 is bent, the internal stress that causes a slip at one end of the flexible display 700 may be formed in the counterclockwise direction in the bending part 721 as indicated by 801 in FIG. 8. In the comparative example, when the plurality of layers 611, 612, 613, 614, 615, 616, and 617 are attached to each other, the internal stress may generate a force 802 that lifts one end 722A of the extension part 722, and the force 802 may lift or warp a portion of the flexible display 700. In the comparative example, a phenomenon that a portion of the flexible display 700 is lifted or warped by the force 802 may cause product defects and/or make it difficult to slide the flexible display 700, so that more force may be required to slide the flexible display 700.

According to various example embodiments, an electronic device (e.g., the electronic device 101 in FIG. 1) includes: a housing (e.g., the first housing 210 and the second housing 220 in FIG. 3A), and a flexible display (e.g., the flexible display 230 in FIG. 3A) in which an area of a display region is configured to be adjusted in conjunction with a sliding movement of at least a portion (e.g., the first housing 210 in FIG. 3A) of the housing. The flexible display may include a first region (e.g., the first region 230a in FIG. 3A) fixedly visible from outside through a first direction of the electronic device, a second region (e.g., the second region 230b in FIG. 3A) extending from one end of the first region and variably visible from the outside based on the movement of the housing, and including a first bending part (e.g., the first bending part 910 in FIG. 9) bent from one end of the first region in a second direction opposite to the first direction and disposed to face a second lateral direction perpendicular to the first direction, and a first extension part (e.g., the first extension part 920 in FIG. 9) extending from one end of the first bending part and disposed in parallel with the first region, and a second bending part (e.g., the second bending part 930 in FIG. 9) bent from one end of the first extension part in the second direction and disposed to face a first lateral direction opposite to the second lateral direction.

According to an example embodiment, the flexible display may further include a second extension part (e.g., the second extension part 940 in FIG. 9) extending from one end of the second bending part and disposed in parallel with the first region and the first extension part, and the second extension part may be attached to a lower surface of the first extension part facing the second direction by an adhesive.

According to an example embodiment, the second extension part may be fixed adjacent to a lower surface of the first extension part facing the second direction by at least one fastener (e.g., the fixing member 1210 in FIG. 12) penetrating the first extension part and the second extension part.

According to an example embodiment, at least one hole forming a path through which the fastener passes may be formed in the first extension part and the second extension part.

According to an example embodiment, the second extension part may be fixed adjacent to a lower surface of the first extension part facing the second direction by a cover disposed in the first lateral direction from the second bending part to surround at least a portion of the first extension part, the second bending part, and at least a portion of the second extension part.

According to an example embodiment, the cover may include a space into which at least a portion of the first extension part, the second bending part, and at least a portion of the second extension part are inserted.

According to an example embodiment, a radius of curvature of the second bending part may be greater than 0.1 R (radius).

Figure 16:
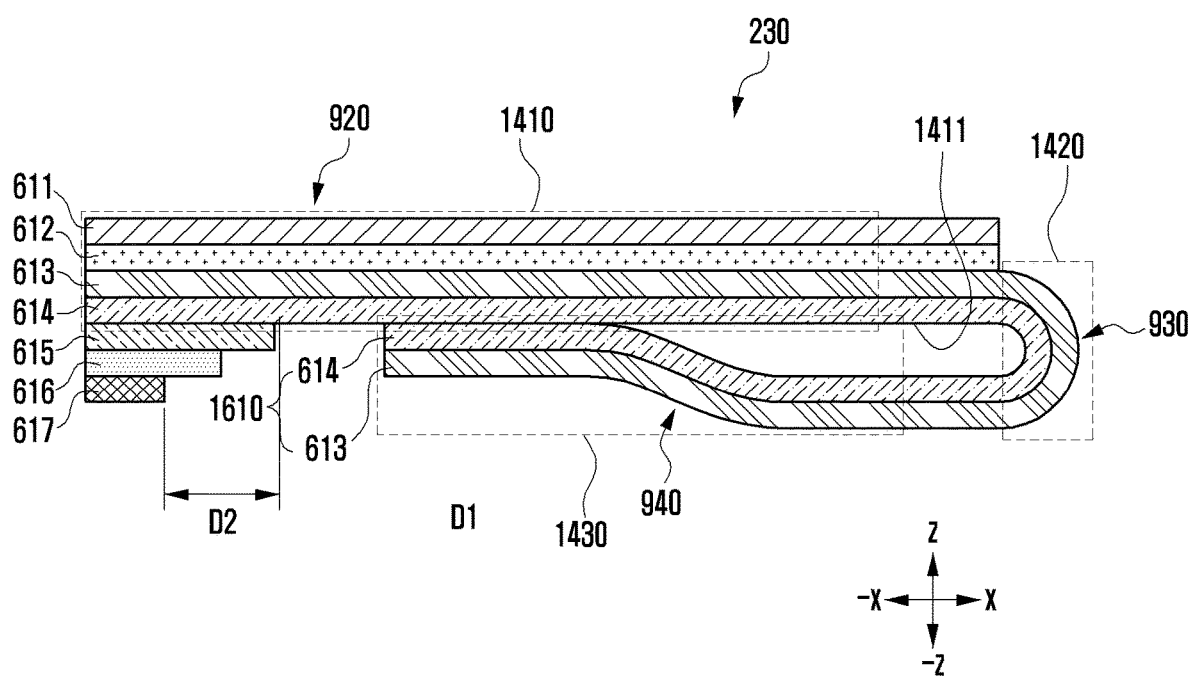
FIG. 16 is a diagram illustrating an example reduction of a slip phenomenon in a flexible display according to various embodiments.

According to an example embodiment, the flexible display may include a plurality of layers, and the second bending part and the second extension part may be formed by some designated layers (e.g., the protection member 613 and the display panel 614 in FIG. 16) among the plurality of layers.

According to an example embodiment, the plurality of layers of the flexible display may include a protection layer, a display panel disposed on the protection layer, a polarization layer disposed on the display panel, a glass layer disposed on the polarization layer, and a polymer layer disposed on the glass layer and forming an outermost layer of the flexible display in the first bending part, and the second bending part and the second extension part may be formed by at least a portion of the protection layer and at least a portion of the display panel.

According to an example embodiment, the some designated layers including the protection layer and the display panel may include a first portion forming a portion of the first extension part, a second portion bent from the first portion in the second direction and forming the second bending part, and a third portion extending from one end of the second portion and disposed in parallel with the first portion.

According to an example embodiment, one end of the third portion may be fixed to a lower surface of the first portion facing the second direction.

According to an example embodiment, a radius of curvature of the first bending part may be greater than a radius of curvature of the second bending part.

According to an example embodiment, the first bending part and the first extension part may be formed by all layers of a plurality of layers of the flexible display.

According to an example embodiment, the housing may include a first housing having a first space formed through a first lateral surface, a second lateral surface extending in a direction perpendicular to the first lateral surface, and a third lateral surface extending in parallel with the first lateral surface, and a second housing slidably combined with the first housing and having a second space.

According to an example embodiment, the electronic device may further include a bendable support connected to the first housing, accommodated at least in part in the second space in a slide-in state, forming at least in part a same plane as the first housing in a slide-out state, and configured to guide a movement of the flexible display.

According to various example embodiments, a flexible display applied to an electronic device may include: a first region fixedly visible from outside through a first direction of the electronic device, a second region extending from one end of the first region and variably visible from the outside based on a change in a shape of the electronic device, and including a first bending part bent from one end of the first region in a second direction opposite to the first direction and disposed to face a second lateral direction perpendicular to the first direction, and a first extension part extending from one end of the first bending part and disposed in parallel with the first region, and a second bending part bent from one end of the first extension part in the second direction and disposed to face a first lateral direction opposite to the second lateral direction.

According to an example embodiment, the flexible display may further include a second extension part extending from one end of the second bending part and disposed in parallel with the first region and the first extension part, and the second extension part may be attached to a lower surface of the first extension part facing the second direction by an adhesive member.

According to an example embodiment, the second extension part may be fixed adjacent to a lower surface of the first extension part facing the second direction by at least one fastener penetrating the first extension part and the second extension part.

According to an example embodiment, the second extension part may be fixed adjacent to a lower surface of the first extension part facing the second direction by a cover member disposed in the first lateral direction from the second bending part to surround at least a portion of the first extension part, the second bending part, and at least a portion of the second extension part.

According to an example embodiment, the flexible display may include a plurality of layers, and the second bending part and the second extension part may be formed by some designated layers among the plurality of layers.

FIG. 9 is a cross-sectional view illustrating an example structure of a flexible display 230 according to various embodiments.

The flexible display 230 illustrated in FIG. 9 may be similar at least in part to the flexible display 230 illustrated in FIGS. 2A to 5B and 6 or may include any embodiment. Hereinafter, with reference to FIG. 9, features of the flexible display 230 that have not been described above or different from the above description will be mainly described.

Referring to FIG. 9, the flexible display 230 (e.g., the flexible display 230 in FIG. 2A) according to an embodiment is a structure for preventing or reducing the phenomena of the comparative example described with reference to FIG. 7, and may further include a second bending part 930 and a second extension part 940. In various embodiments, the second extension part 940 may be omitted.

According to an embodiment, the flexible display 230 may include a first region 230a (e.g., the first region 230a in FIG. 3A) fixedly visible from the outside through a first direction (the z direction) of the electronic device 200 (e.g., the electronic device 200 in FIG. 2A), and a second region 230b (e.g., the second region 230b in FIG. 3A) extending from one end of the first region 230a and variably visible from the outside in conjunction with the movement of the housing.

According to an embodiment, the second region 230b of the flexible display 230 may include a first bending part 910 bent from one end of the first region 230a in a second direction (the −z direction) opposite to the first direction (the z direction) and thereby disposed to face a second lateral direction (the −x direction) perpendicular to the first direction (the z direction), and a first extension part 920 extended from one end of the bending part and disposed in parallel with the first region 230a. For example, the second lateral direction (−x) may be a slide-in direction of the first housing 210 from the second housing 220.

According to an embodiment, the first bending part 910 and the first extension part 920 may be formed by all layers of the plurality of layers 611, 612, 613, 614, 615, 616, and 617 of the flexible display 230.

According to an embodiment, in the first bending part 910, the polymer layer 617 may form the outermost layer of the flexible display 230, and the metal plate 611 may form the innermost layer of the flexible display 230.

According to an embodiment, the flexible display 230 may further include a second bending part 930 bent from one end of the first extension part 920 in the second direction (the −z direction) and thereby disposed to face a first lateral direction (the x direction) opposite to the second lateral direction (the −x direction), and a second extension part 940 extended from one end of the second bending part 930 and disposed in parallel with the first region 230a and the first extension part 920. For example, the first lateral direction (x) may be a slide-out direction of the first housing 210 from the second housing 220.

According to an embodiment, in the second bending part 930, the polymer layer 617 may form the innermost layer of the flexible display 230, and the metal plate 611 may form the outermost layer of the flexible display 230.

According to an embodiment, because the plurality of layers 611, 612, 613, 614, 615, 616, and 617 forming a stack structure of the flexible display 230 have different radii of curvature in the first bending part 910 of the flexible display 230, a first internal stress 901 of the counterclockwise direction may be generated in the first bending part 910. According to an embodiment, in the first bending part 910 of the flexible display 230, the polymer layer 617 forms the outermost layer among the plurality of layers 611, 612, 613, 614, 615, 616, and 617 and may be subjected to the least stress (e.g., compressive force). According to an embodiment, in the first bending part 910 of the flexible display 230, the metal plate 611 forms the innermost layer among the plurality of layers 611, 612, 613, 614, 615, 616, and 617 and may be subjected to the most stress. According to an embodiment, the deviation of the stress applied to each of the plurality of layers 611, 612, 613, 614, 615, 616, and 617 in the first bending part 910 may cause the first internal stress 901.

According to an embodiment, because the plurality of layers 611, 612, 613, 614, 615, 616, and 617 forming a stack structure of the flexible display 230 have different radii of curvature in the second bending part 930 of the flexible display 230, a second internal stress 902 of the clockwise direction may be generated in the second bending part 930.

According to various embodiments, the direction of the first internal stress 901 and the direction of the second internal stress 902 are opposite to each other, and thus the two forces may cancel each other. In the flexible display 230 according to various embodiments, because the first internal stress 901 by the first bending part 910 and the second internal stress 902 by the second bending part 930 may substantially cancel each other, a slip may not be generated at one end of the flexible display 230, and a phenomenon that a portion of the flexible display 230 is lifted or warped may be reduced. According to an embodiment, in the second bending part 930 of the flexible display 230, the polymer layer 617 forms the innermost layer among the plurality of layers 611, 612, 613, 614, 615, 616, and 617 and may be subjected to the most stress. According to an embodiment, in the second bending part 930 of the flexible display 230, the metal plate 611 forms the outermost layer among the plurality of layers 611, 612, 613, 614, 615, 616, and 617 and may be subjected to the least stress. According to an embodiment, the deviation of the stress applied to each of the plurality of layers 611, 612, 613, 614, 615, 616, and 617 in the second bending part 930 may cause the second internal stress 902 substantially canceling the first internal stress 901.

According to an embodiment, the radius of curvature of the first bending part 910 may be greater than the radius of curvature of the second bending part 930.

According to an embodiment, the radius of curvature of the second bending part 930 may be designed to be greater than a specified radius of curvature in order to prevent and/or reduce plastic deformation of the flexible display 230. For example, the radius of curvature of the second bending part 930 may be greater than 0.1 R (radius). In various embodiments, the radius of curvature of the second bending part 930 may be 0 R (radius). For example, the flexible display 230 may be disposed to be completely folded at the second bending part 930.

Figure 10A:
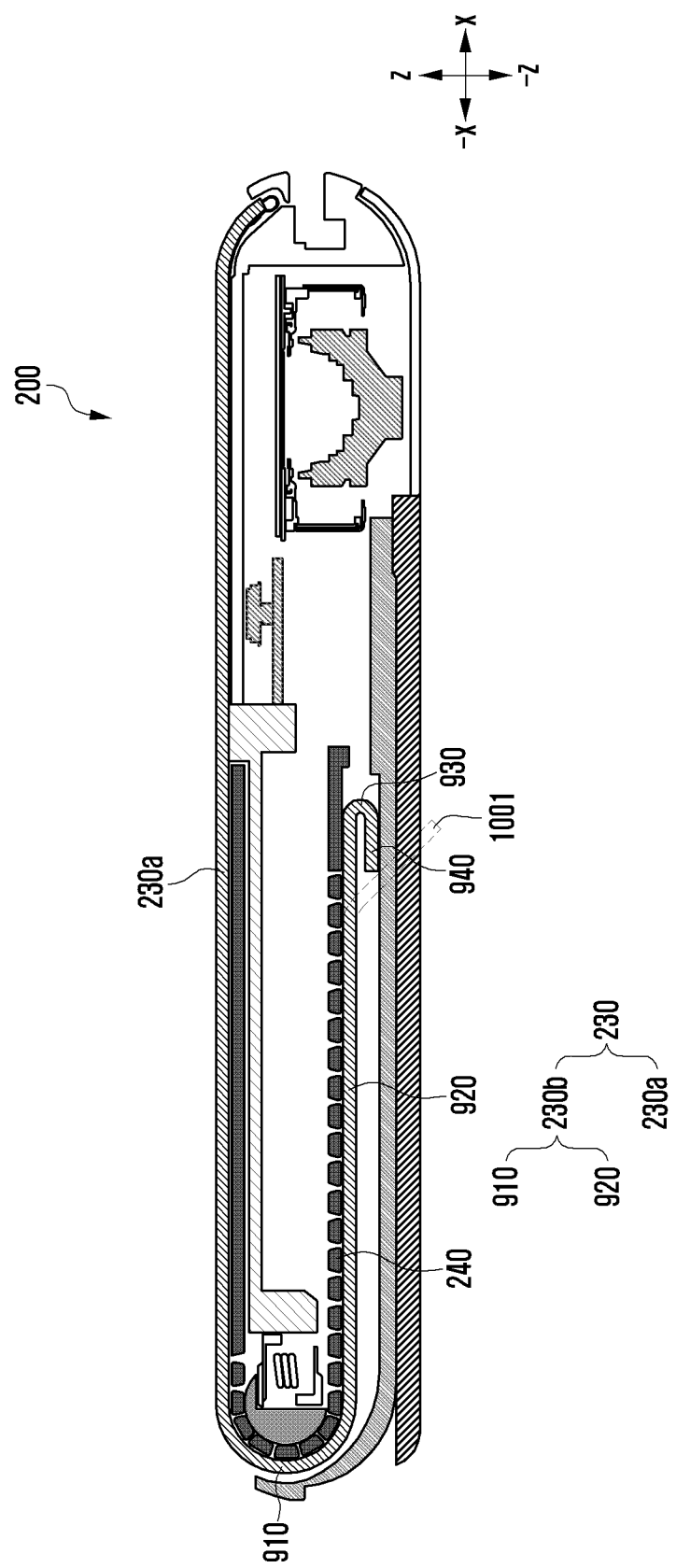
FIG. 10A is a cross-sectional view illustrating a slide-in state of an electronic device according to various embodiments.
Figure 10B:
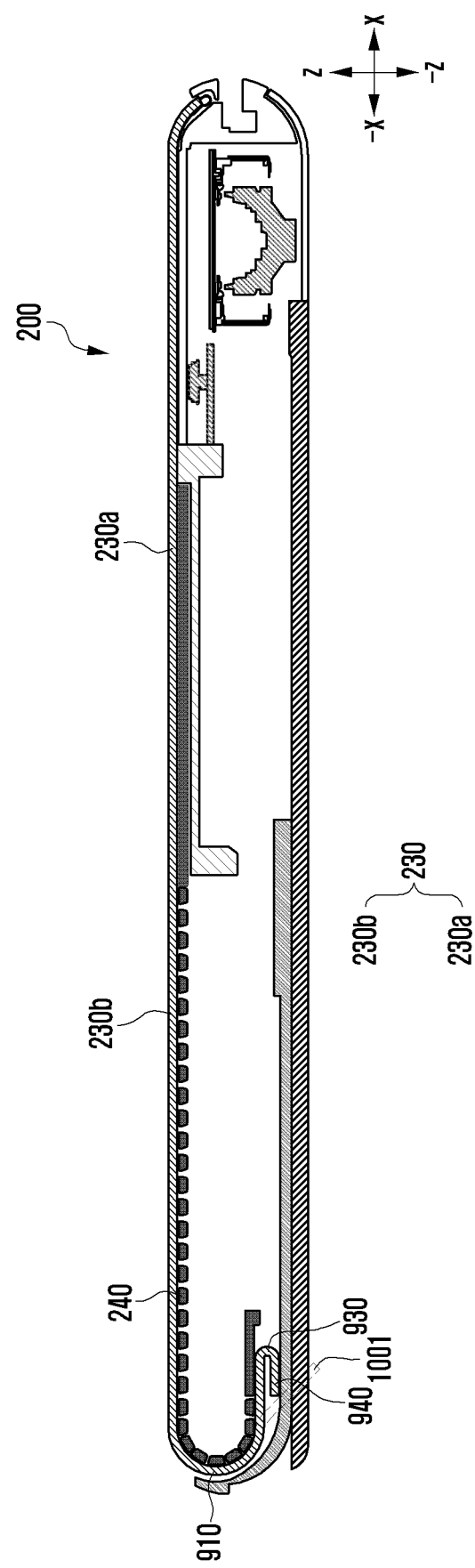
FIG. 10B is a cross-sectional view illustrating a slide-out state of an electronic device according to various embodiments.

FIG. 10A is a cross-sectional view illustrating a slide-in state of an electronic device 200 according to various embodiments. FIG. 10B is a cross-sectional view illustrating a slide-out state of an electronic device 200 according to various embodiments.

The electronic device 200 illustrated in FIGS. 10A and 10B may be similar at least in part to the electronic device 200 illustrated in FIGS. 2A to 5B or may include any other embodiment. The flexible display 230 illustrated in FIGS. 10A and 10B may be similar at least in part to the flexible display 230 illustrated in FIGS. 2A to 5B and 6 or may include any other embodiment. Hereinafter, with reference to FIGS. 10A and 10B, features of the electronic device 200 and the flexible display 230 that have not been described above or different from the above description will be mainly described.

Referring to FIGS. 10A and 10B, the electronic device 200 (e.g., the electronic device 200 in FIG. 2A) according to an embodiment may include a bendable member 240 (e.g., the bendable member 240 in FIG. 5A) (e.g., a multi-joint support structure) that guides the movement of the flexible display 230 (e.g., the flexible display 230 in FIG. 2A). According to an embodiment, in the slide-in state, a second region 230b (e.g., the second region 230b in FIG. 3A) of the flexible display 230 may be disposed invisibly from the outside while being supported by the bendable member 240. According to an embodiment, in the slide-out state, the second region 230b of the flexible display 230 may be disposed to be visible from the outside while being supported by the bendable member 240.

According to an embodiment, the flexible display 230 may further include a second bending part 930 bent from one end of the first extension part 920 in the second direction (the −z direction) and thereby disposed to face a first lateral direction (the x direction) opposite to the second lateral direction (the −x direction), and a second extension part 940 extended from one end of the second bending part 930 and disposed in parallel with a first region 230a (e.g., the first region 230a in FIG. 3A) and the first extension part 920. For example, the second lateral direction (−x) may be a slide-in direction of the first housing 210 from the second housing 220. For example, the first lateral direction (x) may be a slide-out direction of the first housing 210 from the second housing 220.

According to an embodiment, the flexible display 230 further includes the second bending part 930 and the second extension part 940, thereby substantially offsetting the internal stress generated in the first bending part 910 and reducing a phenomenon that at least a portion of the flexible display 230 is lifted or warped.

The electronic device 200 according to various embodiments may reduce a phenomenon that at least a portion of the flexible display 230 is lifted or warped, thereby reducing a frictional force during the sliding movement of the flexible display 230. According to an embodiment, the electronic device 200 may provide a structure allowing a change in the state of the electronic device 200 (e.g., a change from the slide-in state to the slide-out state) even with a small force because of a decrease in the frictional force during the sliding movement of the flexible display 230, offer user convenience, and reduce driving power required for sliding the electronic device 200.

Hereinafter, various embodiments in which the second extension part 940 of the flexible display 230 is fixed will be described in greater detail below with reference to FIGS. 11, 12 and 13.

Figure 11:
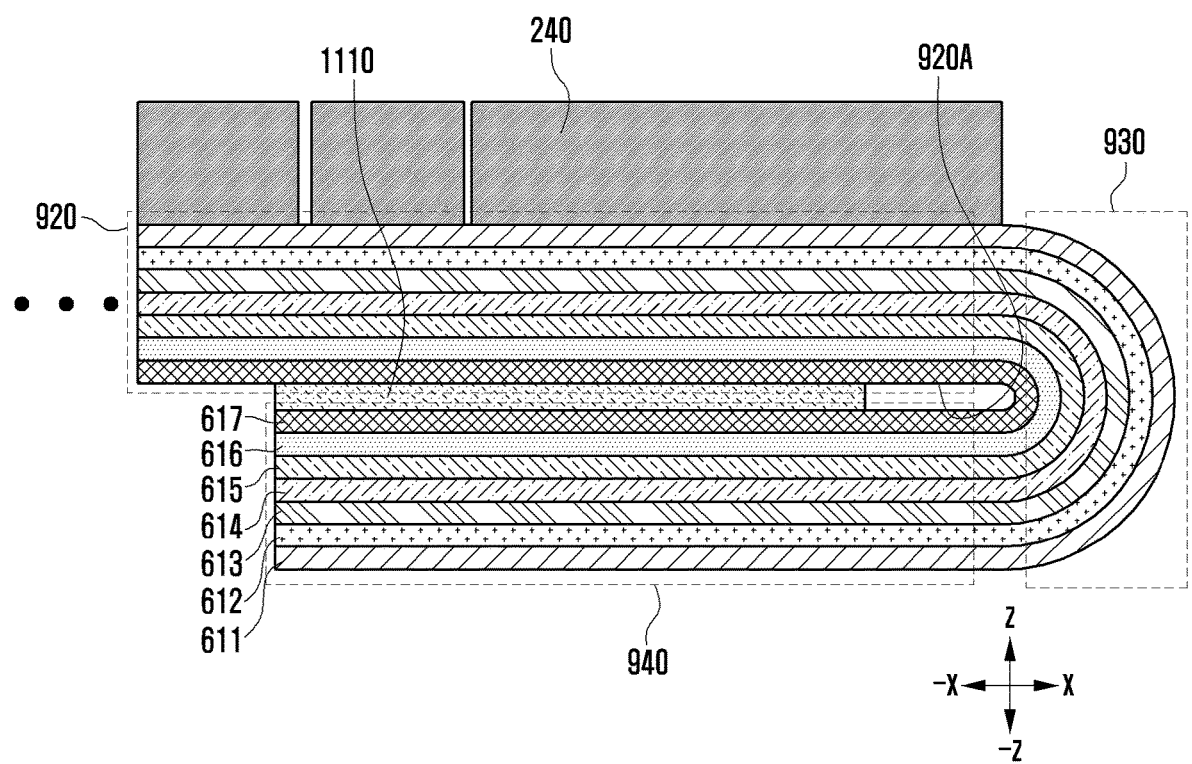
FIG. 11 is a cross-sectional view illustrating a second bending part and a second extension part of a flexible display according to various embodiments.

FIG. 11 is a cross-sectional view illustrating a second bending part 930 and a second extension part 940 of a flexible display 230 according to various embodiments.

The flexible display 230 illustrated in FIG. 11 may be similar at least in part to the flexible display 230 illustrated in FIGS. 2A to 5B, 6, 10A, and 10B or may include any other embodiment. Hereinafter, with reference to FIG. 11, features of the flexible display 230 that have not been described above or different from the above description will be mainly described.

Referring to FIG. 11, the flexible display 230 (e.g., the flexible display 230 in FIG. 2A) according to an embodiment may include an adhesive member 1110 for fixing the second extension part 940. According to an embodiment, the second extension part 940 of the flexible display 230 may be attached to a lower surface 920A of the first extension part 920 facing the second direction (the −z direction) by the adhesive member 1110.

According to an embodiment, the adhesive member 1110 may include at least one of an optical clear adhesive (OCA), a pressure sensitive adhesive (PSA), a heat-reactive adhesive, a normal adhesive, or a double-sided tape.

Figure 12:
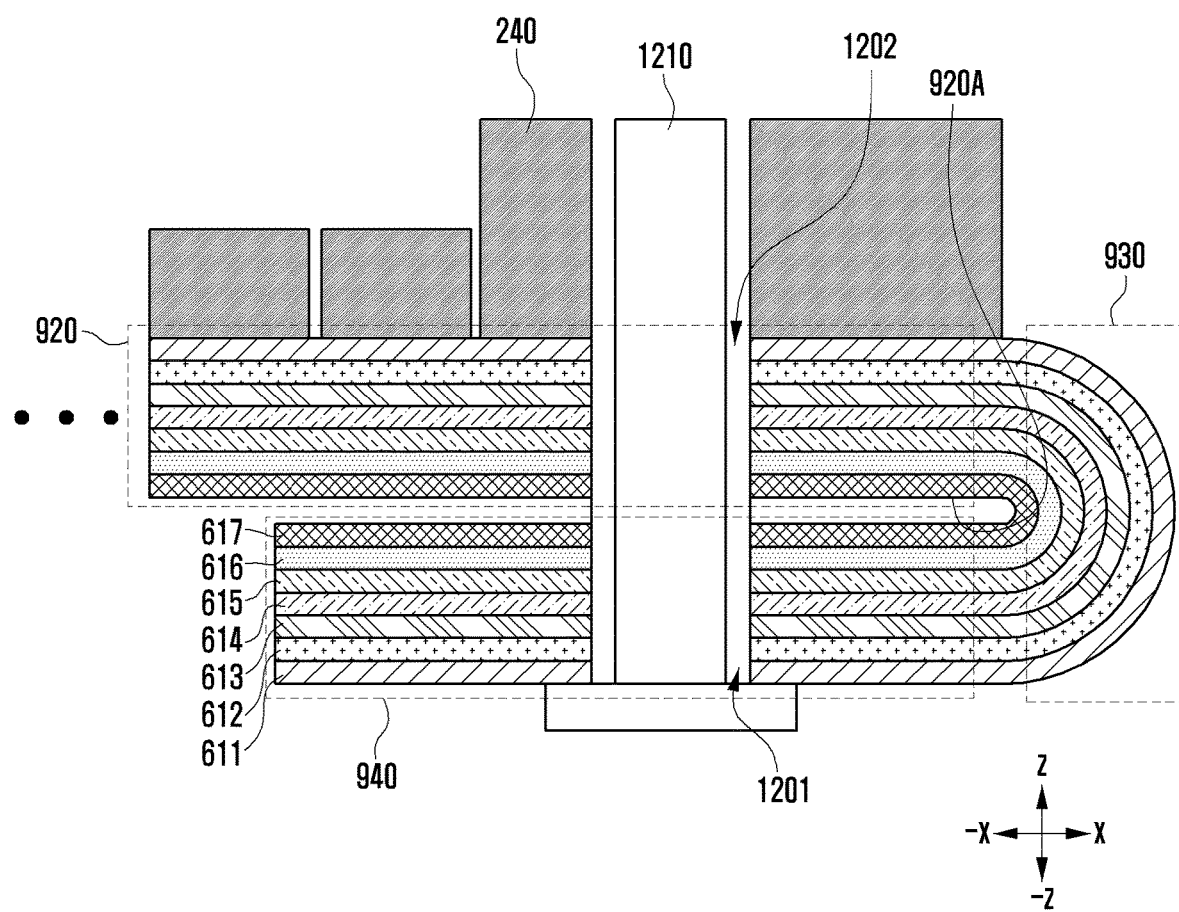
FIG. 12 is a cross-sectional view illustrating a second bending part and a second extension part of a flexible display according to various embodiments.

FIG. 12 is a cross-sectional view illustrating a second bending part 930 and a second extension part 940 of a flexible display 230 according to various embodiments. For example, FIG. 12 may be a cross-sectional view showing a lateral surface of a portion of the flexible display 230 including a fixing member (e.g., fastener) 1210 and a second hole 1201 penetrated by the fixing member (e.g., fastener) 1210.

The flexible display 230 illustrated in FIG. 12 may be similar at least in part to the flexible display 230 illustrated in FIGS. 2A to 5B, 6, 10A, and 10B or may include any other embodiment. Hereinafter, with reference to FIG. 12, features of the flexible display 230 that have not been described above or different from the above description will be mainly described.

Referring to FIG. 12, the flexible display 230 (e.g., the flexible display 230 in FIG. 2A) according to an embodiment may include at least one fixing member (e.g., fastener) 1210 for fixing the second extension part 940. According to an embodiment, by the at least one fixing member 1210 penetrating the first extension part 920 and the second extension part 940, the second extension part 940 may be fixed adjacent to the lower surface 920A of the first extension part 920 facing the second direction (the −z direction).

According to an embodiment, the fixing member 1210 may include a screw, but is not limited thereto. In various embodiments, the fixing member 1210 may further include a rivet or a pin in addition to the screw.

According to an embodiment, at least one hole 1201 and 1202 forming a path through which the fixing member 1210 passes may be formed in the first extension part 920 and the second extension part 940. According to an embodiment, the first extension part 920 may have a first hole 1202 penetrated by the fixing member 1210. According to an embodiment, the second extension part 940 may have a second hole 1201 that overlaps with (or is connected to) the first hole 1202 and is penetrated by the fixing member 1210. According to an embodiment, the diameter of the first hole 1202 and the diameter of the second hole 1201 may be substantially the same as the diameter of the fixing member 1210. In various embodiments, the diameter of the fixing member 1210 may not be constant, and the diameter of the first hole 1202 and the diameter of the second hole 1201 may have a varying form so as to correspond to the shape of the fixing member 1210. For example, the shape of the fixing member 1210 may be a conical shape, and the diameter of the first hole 1202 and the diameter of the second hole 1201 may have a diameter-varying form for allowing the fixing member 1210 having a conical shape to be inserted.

According to an embodiment, the fixing member 1210 may be disposed to pass through the first and second extension parts 920 and 940 of the flexible display 230 and be fastened to the bendable member 240.

Figure 13:
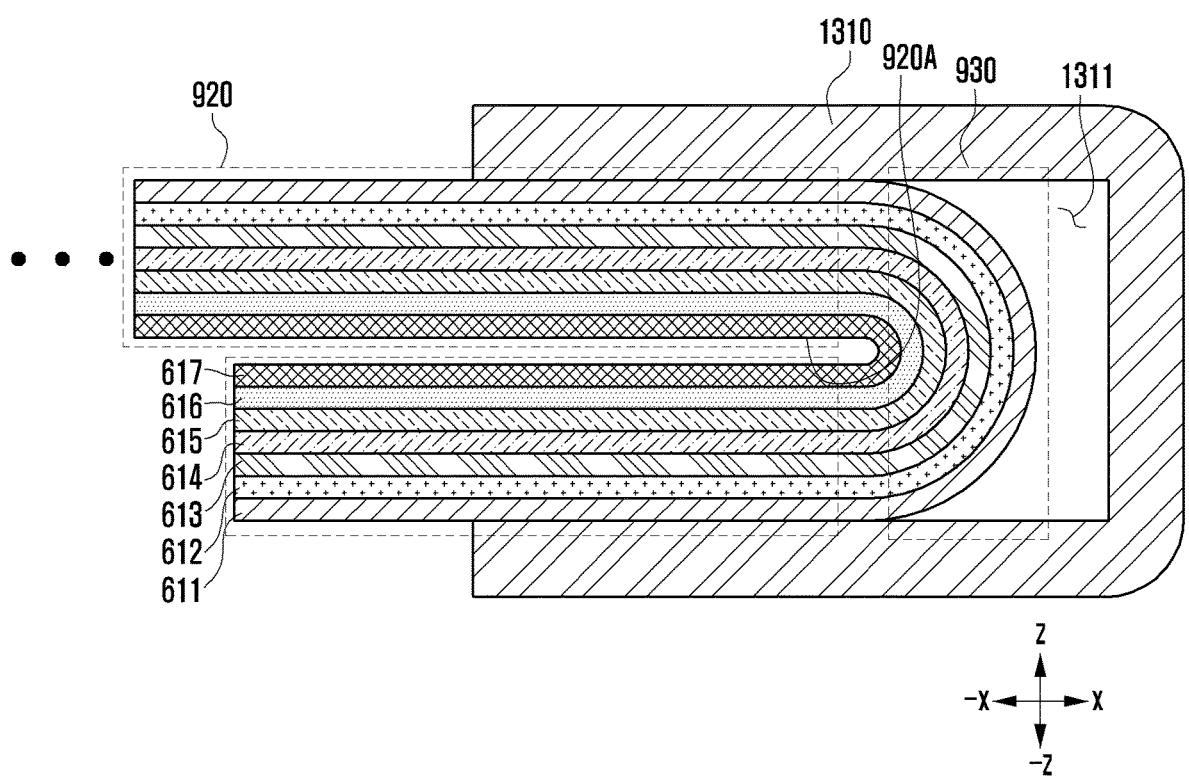
FIG. 13 is a cross-sectional view illustrating a second bending part and a second extension part of a flexible display according to various embodiments.

FIG. 13 is a cross-sectional view illustrating a second bending part 930 and a second extension part 940 of a flexible display 230 according to various embodiments.

The flexible display 230 illustrated in FIG. 13 may be similar at least in part to the flexible display 230 illustrated in FIGS. 2A to 5B, 6, 10A, and 10B or may include any other embodiment. Hereinafter, with reference to FIG. 13, features of the flexible display 230 that have not been described above or different from the above description will be mainly described.

Referring to FIG. 13, the flexible display 230 (e.g., the flexible display 230 in FIG. 2A) according to an embodiment may further include a cover member 1310 for fixing the second extension part 940. According to an embodiment, by the cover member 1310, the second extension part 940 may be fixed adjacent to the lower surface 920A of the first extension part 920 facing the second direction (the −z direction).

According to an embodiment, the cover member 1310 may be disposed in the first lateral direction (x-direction) from the second bending part 930 to surround at least a portion of the first extension part 920, the second bending part 930, and at least a portion of the second extension part 940. For example, the first lateral direction (x) may be a slide-out direction of the first housing 210 from the second housing 220.

According to an embodiment, the cover member 1310 may have a rectangular cross-sectional structure that is open in one direction (e.g., the second lateral direction (the −x direction)), thereby forming a space 1311 into which at least a portion of the first extension part 920, the second bending part 930, and at least a portion of the second extension part 940 are inserted. According to various embodiments, the cover member 1310 may have a shape having a curvature similar to that of the second bending part 930 other than the illustrated shape, and thus the space 1311 may also have a shape having a curvature similar to that of the second bending part 930. In this case, a space into which the second bending part 930 is inserted may be saved. According to an embodiment, the cover member 1310 may be formed of at least one of ceramic, metal (e.g., stainless steel (STS)), plastic, rubber, and/or silicon, but is not limited thereto.

According to an embodiment, although not shown, the cover member 1310 may be fixed by fastening or attaching a portion of the cover member 1310 to the bendable member 240.

According to various embodiments, the structure of the flexible display 230 according to the embodiment described with reference to FIG. 12 and the structure of the flexible display 230 according to the embodiment described with reference to FIG. 13 may be combined with each other. For example, the flexible display 230 may include the fixing member 1210 shown in FIG. 12 and the cover member 1310 shown in FIG. 13.

Figure 14:
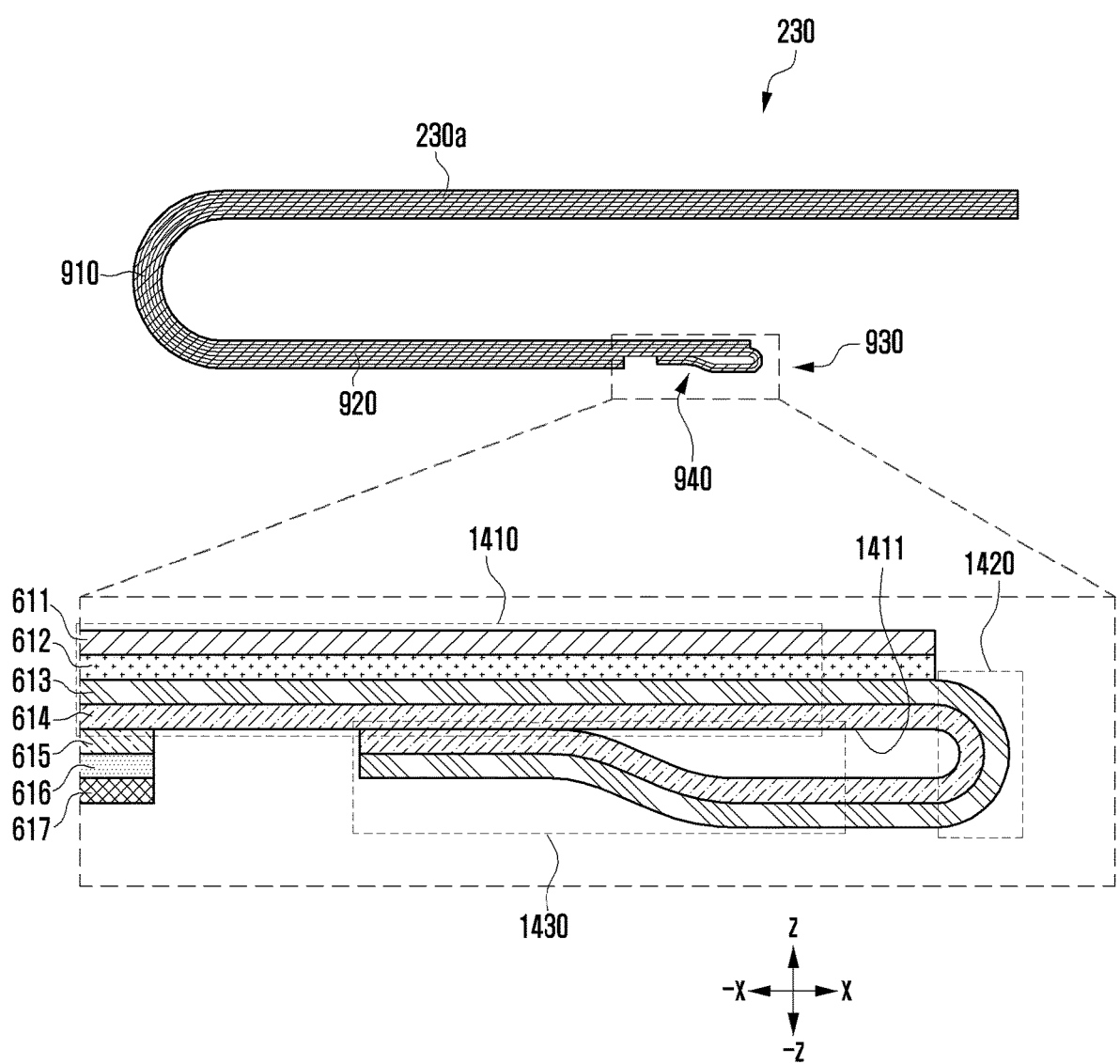
FIG. 14 is a cross-sectional view illustrating an example structure of a flexible display according to various embodiments.

FIG. 14 is a cross-sectional view illustrating a structure of a flexible display 230 according to various embodiments. For example, in the flexible display 230 shown in FIG. 14, some designated layers 613 and 614 of the flexible display 230 may be formed longer than the other layers, and the second bending part 930 and the second extension part 940 may be formed by such designated layers 613 and 614 of the flexible display 230.

The flexible display 230 illustrated in FIG. 14 may be similar at least in part to the flexible display 230 illustrated in FIGS. 2A to 5B, 6, 10A, 10B, and 11 to 13, or may include any other embodiment. Hereinafter, with reference to FIG. 14, features of the flexible display 230 that have not been described above or different from the above description will be mainly described.

Referring to FIG. 14, the flexible display 230 (e.g., the flexible display 230 in FIG. 2A) according to this embodiment further includes the second bending part 930 and the second extension part 940, which may be formed by at least some layers of the flexible display 230. For example, the second bending part 930 and the second extension part 940 may be formed by some designated layers 613 and 614 of the flexible display 230.

In this embodiment, some designated layers may include the protection member 613 and the display panel 614. For example, the second bending part 930 and the second extension part 940 may be formed by at least a portion of the protection member 613 and at least a portion of the display panel 614. For example, in the second bending part 930, the protection member 613 may form the outermost layer of the flexible display 230, and the display panel 614 may form the innermost layer of the flexible display 230.

In an embodiment, although not shown, some designated layers may include the protection member 613, the display panel 614, and the polarization layer 615. For example, the second bending part 930 and the second extension part 940 may be formed by at least a portion of the protection member 613, at least a portion of the display panel 614, and at least a portion of the polarization layer 615. For example, although not shown, in the second bending part 930, the protection member 613 may form the outermost layer of the flexible display 230, and the polarization layer 615 may form the innermost layer of the flexible display 230.

According to various embodiments, at least some layers of the flexible display 230 forming the second bending part 930 and the second extension part 940 may be variously changed other than the above-mentioned examples.

In an embodiment, some designated layers (e.g., the protection member 613 and the display panel 614) of the flexible display 230 forming the second bending part 930 and the second extension part 940 may include a first portion 1410 forming a portion of the first extension part 920, a second portion 1420 bent from the first portion 1410 in the second direction (the −z direction) and thereby forming the second bending part 930, and a third portion 1430 extended from one end of the second portion 1420 and disposed in parallel with the first portion 1410.

In an embodiment, one end of the third portion 1430 may be fixed to a lower surface 1411 of the first portion 1410 facing the second direction (the −z direction).

In an embodiment, although not shown, one end of the third portion 1430 may be fixed to the lower surface of the first portion 1410 by an adhesive member. According to an embodiment, the adhesive member may include at least one of an optical clear adhesive (OCA), a pressure sensitive adhesive (PSA), a heat-reactive adhesive, a normal adhesive, or a double-sided tape.

According to various embodiments, the flexible display 230 shown in FIG. 14 may be combined with the structure of the flexible display 230 according to the embodiment described with reference to FIG. 12 and/or the structure of the flexible display 230 according to the embodiment described with reference to FIG. 13.

Figure 15:
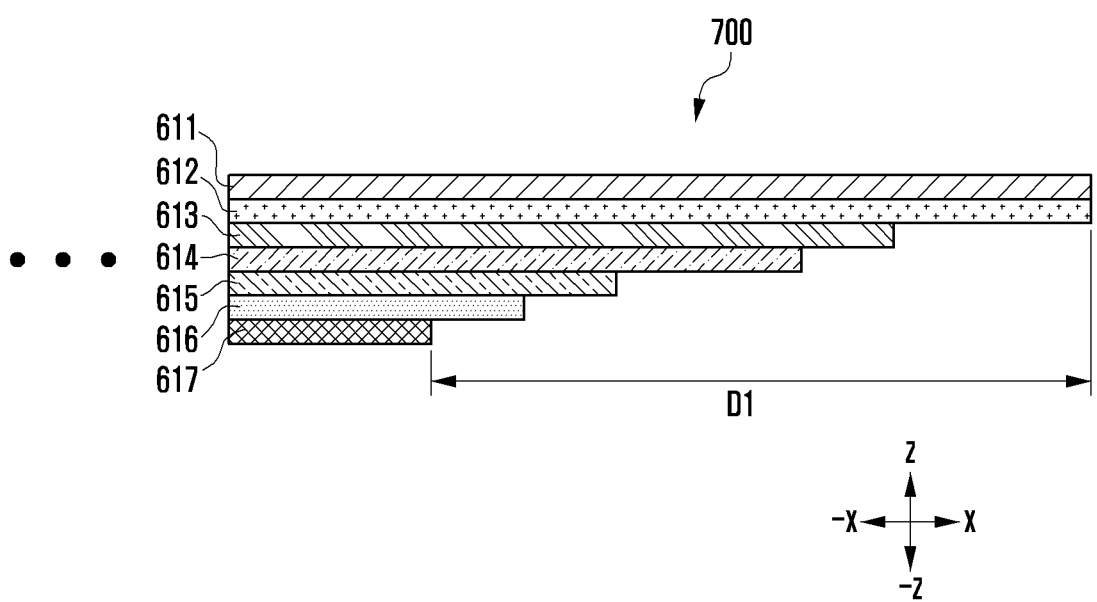
FIG. 15 is an diagram illustrating a slip phenomenon of a flexible display according to a comparative example.

FIG. 15 is a diagram illustrating an example slip phenomenon of a flexible display 230 according to a comparative example. FIG. 16 is a diagram illustrating an example of a reduction of a slip phenomenon in a flexible display 230 according to various embodiments. For example, FIG. 15 may illustrate a tested slip phenomenon based on the structure of the flexible display 230 shown in FIG. 7. For example, FIG. 16 may illustrate a tested slip phenomenon based on the structure of the flexible display 230 shown in FIG. 14.

Referring to FIG. 15, because the flexible display 700 according to the comparative example is configured such that at least a portion is bent, length deviations and/or slips among the plurality of layers 611, 612, 613, 614, 615, 616, and 617 may occur at one end of the flexible display 700. For example, the plurality of layers 611, 612, 613, 614, 615, 616, and 617 of a stack structure of the flexible display 700 may be different in the degree of protrusion at one end of the flexible display 700. In the comparative example, the length deviations and/or slips among the plurality of layers 611, 612, 613, 614, 615, 616, and 617 may have a maximum first length D1.

Referring to FIG. 16, the flexible display 230 (e.g., the flexible display 230 in FIG. 2A) according to an embodiment further includes the second bending part 930 and the second extension part 940, which may be formed by at least some layers 1610 of the flexible display 230. In an embodiment, the at least some layers 1610 may include the protection member 613 and the display panel 614. For example, the at least some layers 1610 forming the second bending part 930 and the second extension part 940 are layers used by the flexible display 230 to display a screen, and may include, for example, the display panel 614 having power supply wiring and control signal wiring.

In an embodiment, the length deviations and/or slips among the plurality of layers 615, 616, and 617 in the first extension part 920 except the second bending part 930 and the second extension part 940 may have a maximum second length D2. The second length D2 according to an embodiment may be smaller than the first length D1 according to the comparative example. For example, the flexible display 230 according to an embodiment includes the second bending part 930 and the second extension part 940 formed by some designated layers 1610 of the flexible display 230, so that the length deviation and/or slip between layers may occur in the layers 615, 616, and 617 other than some layers 1610. Therefore, compared to the comparative example, the flexible display 230 according to an embodiment may reduce the length deviation and/or slip between the plurality of layers 615, 616, and 617, and also reduce internal stress and friction force during slide movement. For example, the first length D1 according to the comparative example may have a length of about 2 times to about 3 times the second length D2 according to an embodiment.

Various embodiments of the disclosure may form the second bending part in the flexible display, thereby substantially offsetting the internal stress causing the length deviation and/or slip between the plurality of layers, and reducing the lifting or warping phenomenon in at least a portion of the flexible display.

Various embodiments of the disclosure may reduce the phenomenon that at least a portion of the flexible display is lifted or warped, thereby allowing the flexible display to easily slide with a small force, offering user convenience, and reducing driving power of the electronic device.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A portable communication device comprising:
   a housing; and
   a flexible display including a portion configured to be rolled out of or into the housing based on a sliding movement of at least one portion of the housing, the flexible display including:
      a first region visible via a front side of the portable communication device when the portion of the flexible display is fully rolled into the housing;
      a first bending part extended from one end of the first region and bent as facing a first lateral side of the portable communication device when the portion of the flexible display is fully rolled into the housing;
      a first extension part extended from one end of the first bending part as substantially parallel with the first region when the portion of the flexible display is fully rolled into the housing;
      a second bending part extended from one end of the first extension part and bent as facing a second lateral side of the portable communication device opposite to the first lateral side when the portion of the flexible display is fully rolled into the housing; and
      a second extension part extended from one end of the second bending part as substantially parallel with the first extension part when the portion of the flexible display is fully rolled into the housing, the second extension part coupled to a lower surface of the first extension part such that the second bending part and the second extension part concurrently move toward the first lateral side according to the portion of the flexible display being at least partially rolled out of the housing.

2. The portable communication device of claim 1, wherein an upper surface of the second extension part is attached to the lower surface of the first extension part by an adhesive.

3. The portable communication device of claim 1, wherein an upper surface of the second extension part is attached to the lower surface of the first extension part by a fastener penetrating the first extension part and the second extension part.

4. The portable communication device of claim 1, wherein the second extension part is fixed adjacent to a lower surface of the first extension part facing a first direction by a cover disposed in a lateral direction from the second bending part to surround at least a portion of the first extension part, the second bending part, and at least a portion of the second extension part.

5. The portable communication device of claim 4, wherein the cover includes a space into which at least a portion of the first extension part, the second bending part, and at least a portion of the second extension part are insertable.

6. The portable communication device of claim 1, wherein a radius of curvature of the second bending part is greater than 0.1 R (radius).

7. The portable communication device of claim 1, wherein the flexible display includes a plurality of layers, and
   wherein the second bending part and the second extension part include some designated layers among the plurality of layers.

8. The portable communication device of claim 7, wherein the plurality of layers of the flexible display includes:
   a protection layer;
   a display panel disposed on the protection layer;
   a polarization layer disposed on the display panel;
   a glass layer disposed on the polarization layer; and
   a polymer layer disposed on the glass layer and forming an outermost layer of the flexible display in the first bending part, and
   wherein the second bending part and the second extension part are formed by at least a portion of the protection layer and at least a portion of the display panel.

9. The portable communication device of claim 8, wherein the some designated layers including the protection layer and the display panel include:

a first portion forming a portion of the first extension part;

a second portion bent from the first portion in a first direction and forming the second bending part; and a third portion extending from one end of the second portion and disposed in parallel with the first portion.

10. The portable communication device of claim 9, wherein one end of the third portion is fixed to a lower surface of the first portion facing the first direction.

11. The portable communication device of claim 1, wherein a radius of curvature of the first bending part is greater than a radius of curvature of the second bending part.

12. The portable communication device of claim 7, wherein the first bending part and the first extension part include all layers of a plurality of layers of the flexible display.

13. The portable communication device of claim 1, wherein the housing includes:

a first housing including a first space formed through a first lateral surface, a second lateral surface extending in a direction perpendicular to the first lateral surface, and a third lateral surface extending in parallel with the first lateral surface, and a second housing slidably combined with the first housing and including a second space.

14. The portable communication device of claim 13, further comprising:

a bendable support connected to the first housing, accommodated at least in part in the second space in a slide-in state, forming at least in part a same plane as the first housing in a slide-out state, and configured to guide a movement of the flexible display.

* * * * *